(12) United States Patent
Mi et al.

(10) Patent No.: US 8,518,789 B2
(45) Date of Patent: Aug. 27, 2013

(54) INTEGRATED ELECTRONIC DEVICE AND METHOD OF MAKING THE SAME

(75) Inventors: Xiaoyu Mi, Kawasaki (JP); Yoshihiro Mizuno, Kawasaki (JP); Tsuyoshi Matsumoto, Kawasaki (JP); Hisao Okuda, Kawasaki (JP); Satoshi Ueda, Kawasaki (JP); Takeo Takahashi, Nagano (JP)

(73) Assignees: Fujitsu Limited, Kawasaki (JP); Taiyo Yuden Co., Ltd., Tokyo (JP)

( * ) Notice: Subject to any disclaimer, the term of this patent is extended or adjusted under 35 U.S.C. 154(b) by 195 days.

(21) Appl. No.: 13/064,347

(22) Filed: Mar. 21, 2011

(65) Prior Publication Data
US 2011/0171806 A1 Jul. 14, 2011

Related U.S. Application Data

(62) Division of application No. 11/509,577, filed on Aug. 25, 2006, now Pat. No. 7,948,056.

(30) Foreign Application Priority Data

Aug. 31, 2005 (JP) ................................. 2005-252596

(51) Int. Cl.
*H01L 21/20* (2006.01)
(52) U.S. Cl.
USPC ............ 438/381; 438/124; 257/531; 257/528
(58) Field of Classification Search
USPC .......................... 438/381, 124; 257/531, 528
See application file for complete search history.

(56) References Cited

U.S. PATENT DOCUMENTS

| | | | |
|---|---|---|---|
| 5,370,766 A | 12/1994 | Desaigoudar et al. | |
| 5,446,309 A | 8/1995 | Adachi et al. | |
| 5,629,533 A | 5/1997 | Ackley et al. | |
| 6,661,078 B2 | 12/2003 | Shitara | |
| 6,885,275 B1 | 4/2005 | Chang | |
| 2004/0201074 A1* | 10/2004 | Khandros et al. ............. | 257/459 |
| 2005/0184358 A1 | 8/2005 | Lin | |
| 2006/0204650 A1* | 9/2006 | Hu ............................... | 427/96.1 |

FOREIGN PATENT DOCUMENTS

JP  4-61264  2/1992

OTHER PUBLICATIONS

A. Sutono, et al.; "RF/Microwave Characterization of Multilayer Ceramic-Based MCM Technology;" *IEEE Transactions on Advanced Packaging*; vol. 22; No. 3; Aug. 1999; pp. 326-331.
G. Lihui, et al.; "High Q Multilayer Spiral Inductor on Silicon Chip for 5~6 Ghz;" *IEEE Electron Device Letters*; vol. 23; No. 8; Aug. 2002; pp. 470-472.

* cited by examiner

*Primary Examiner* — Telly Green
(74) *Attorney, Agent, or Firm* — Kratz, Quintos & Hanson, LLP

(57) ABSTRACT

An integrated electronic device includes a substrate, passive components, pads for external connection, and three-dimensional wiring. The passive components includes a multi-stage coil inductor provided on the substrate. The multi-stage coil inductor has a plurality of coils disposed in several layers. Mutually adjacent coil wires are spaced-apart from each other. The three-dimensional wiring includes a first wiring portion which extends on the substrate, a second wiring portion which extends off the substrate but along the substrate, and a third wiring portion connecting with the first wiring portion and the second wiring portion.

4 Claims, 33 Drawing Sheets

FIG. 11
(a)
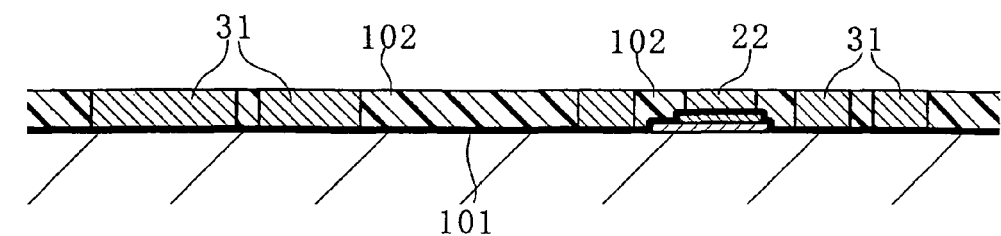
(b)
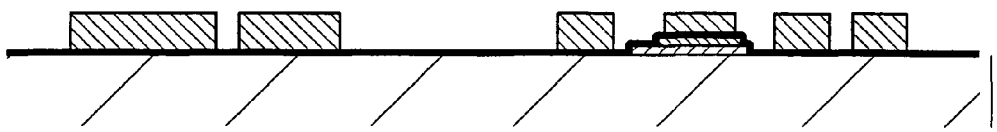
(c)
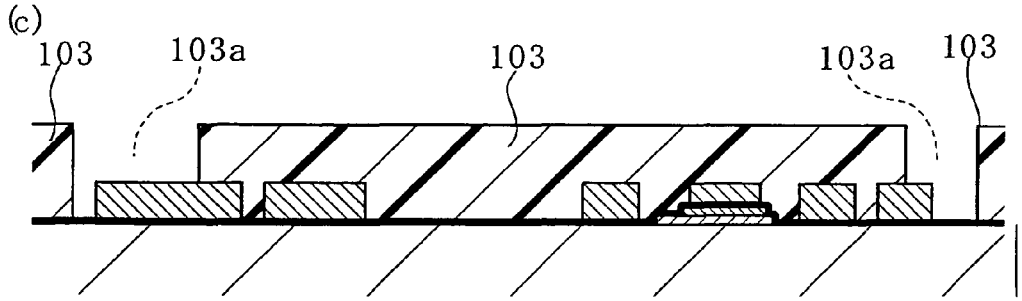
(d)
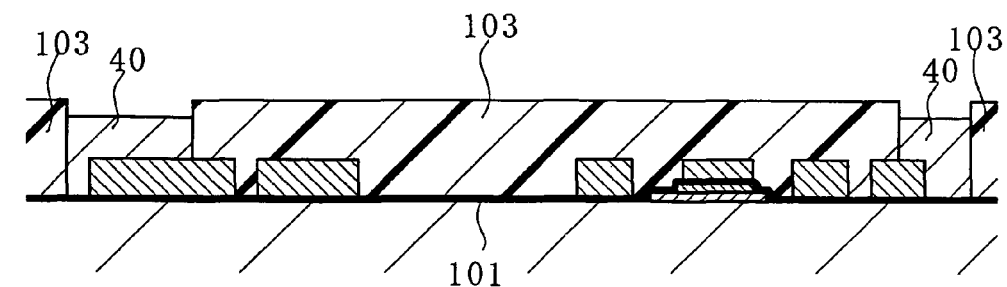

FIG. 12
(a)
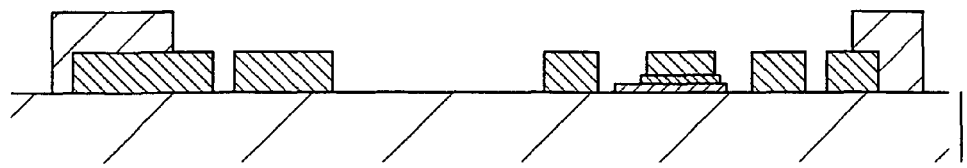
(b)
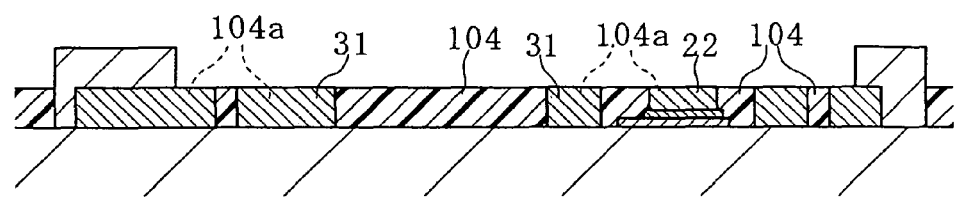
(c)
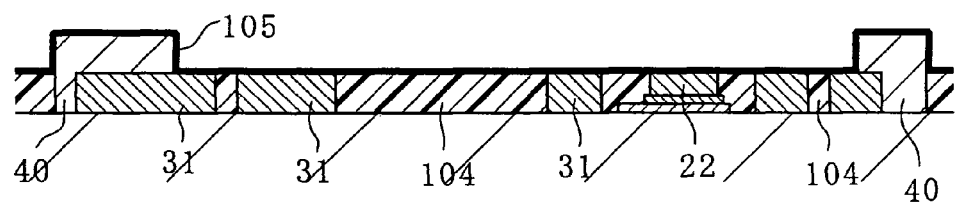
(d)
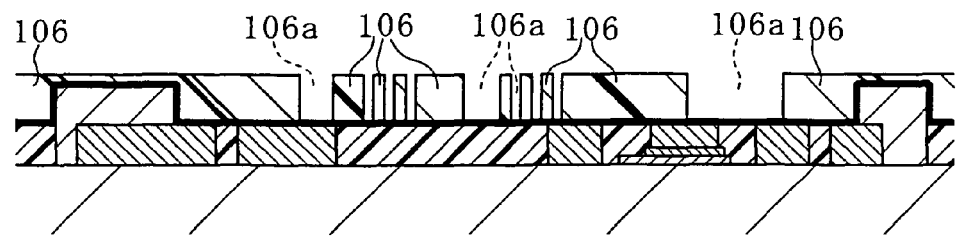

FIG. 13
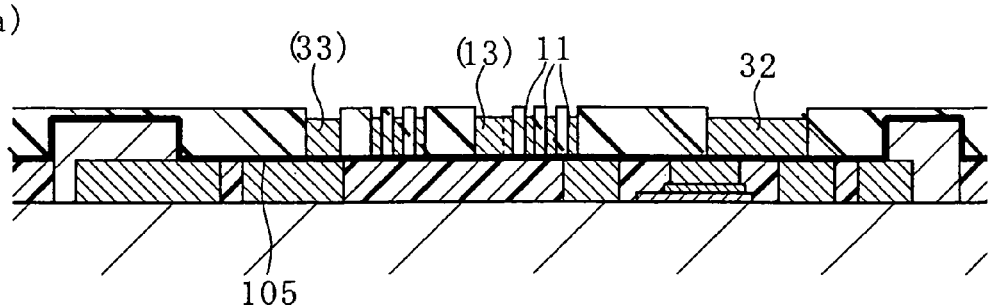
(a)
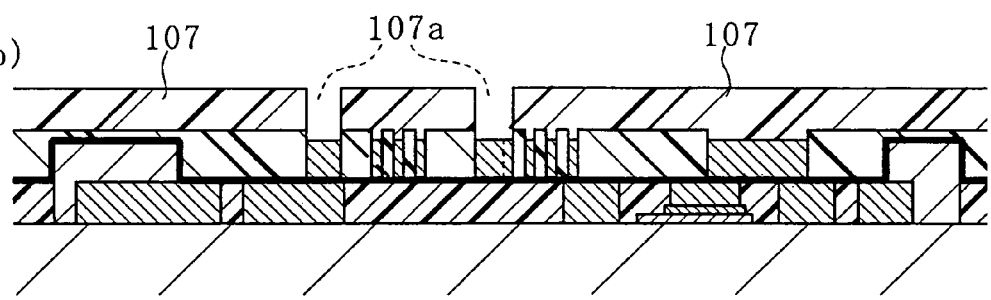
(b)
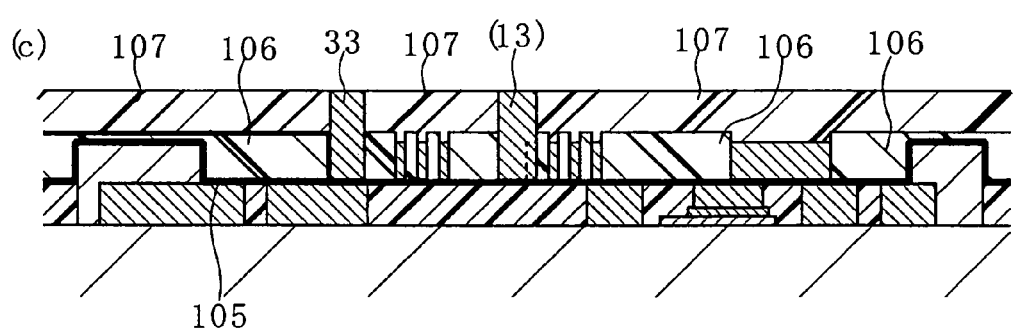
(c)
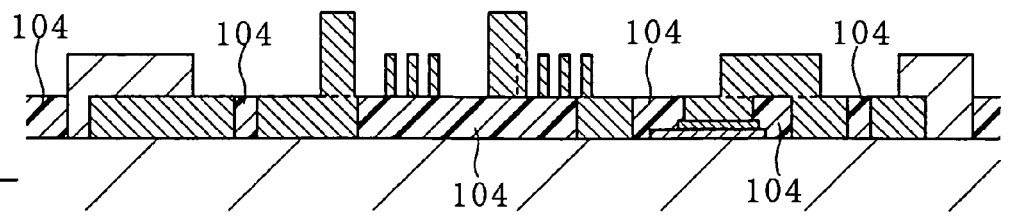
(d)

FIG. 14
(a)
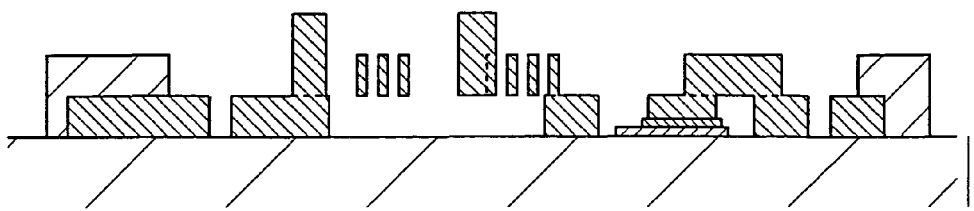
(b)
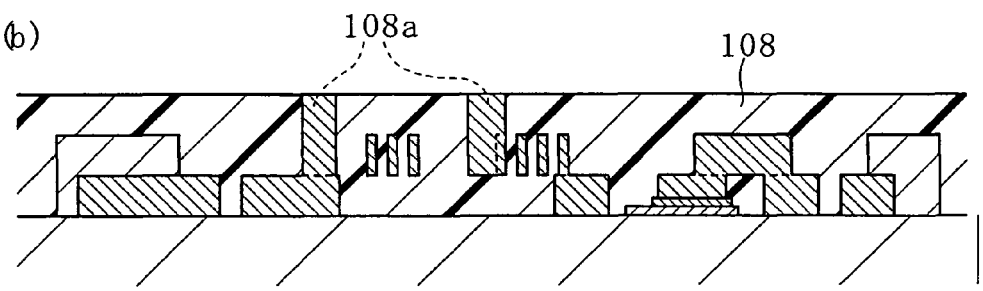
(c)
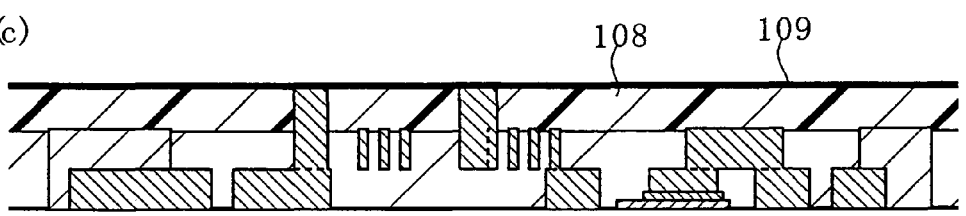
(d)
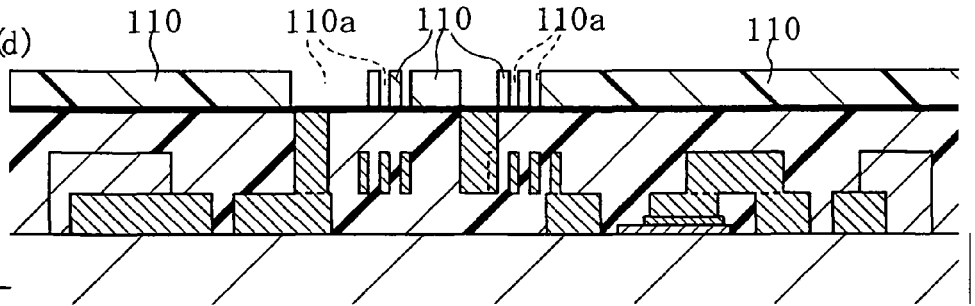

FIG. 15
(a)
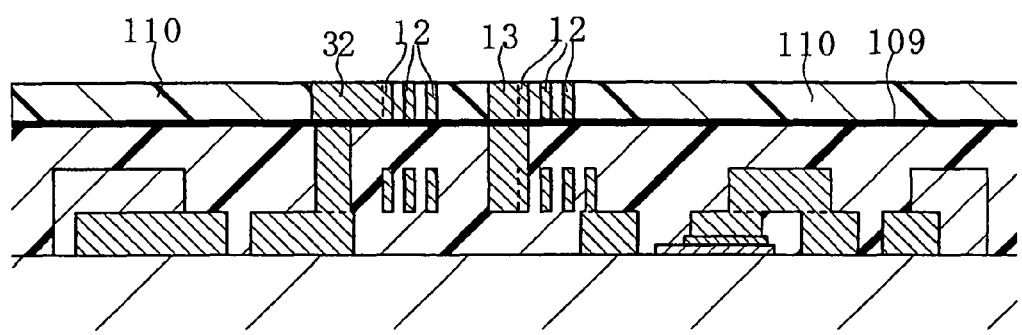
(b)
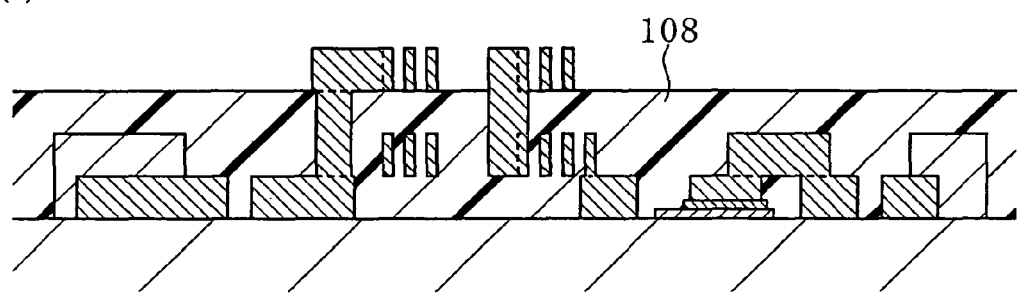
(c)
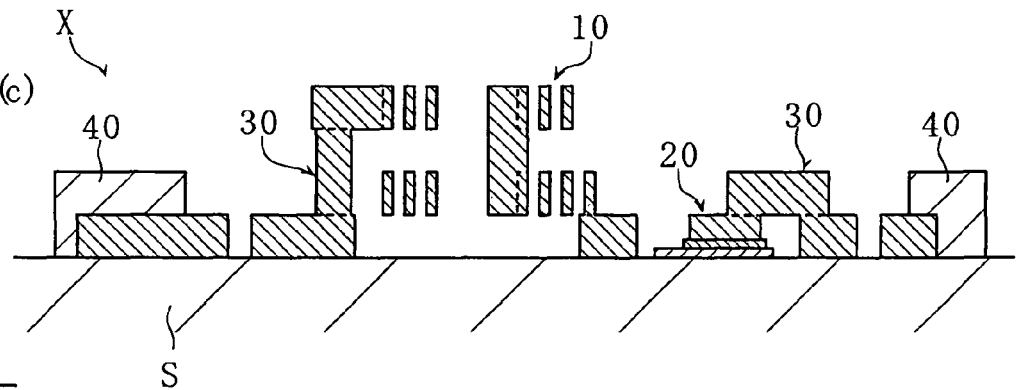

FIG. 20
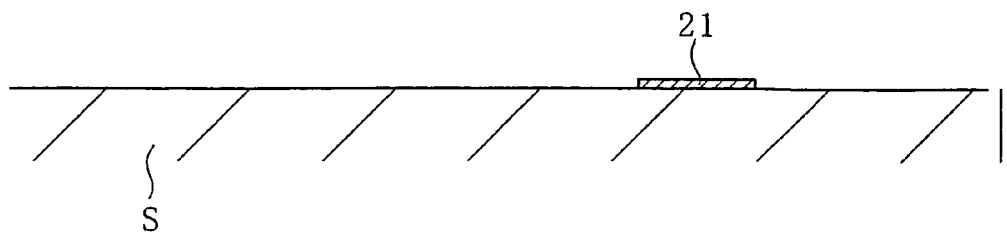
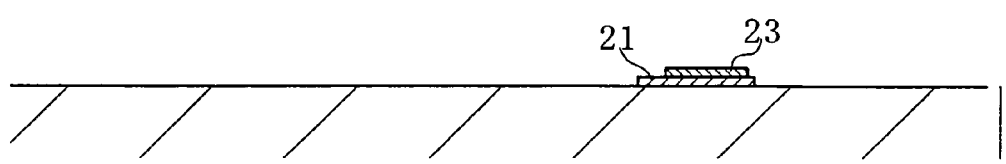
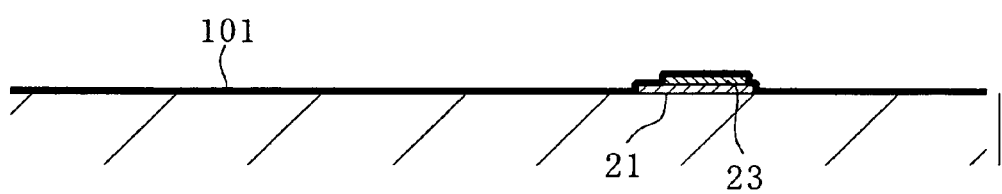
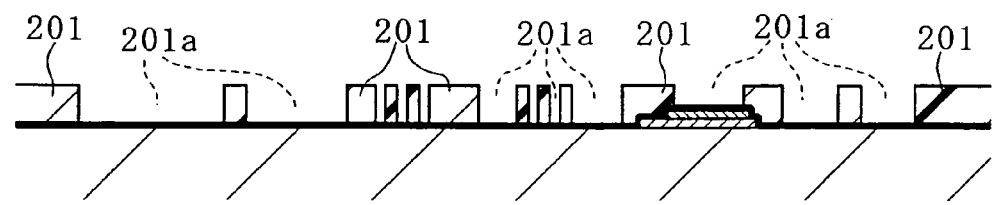
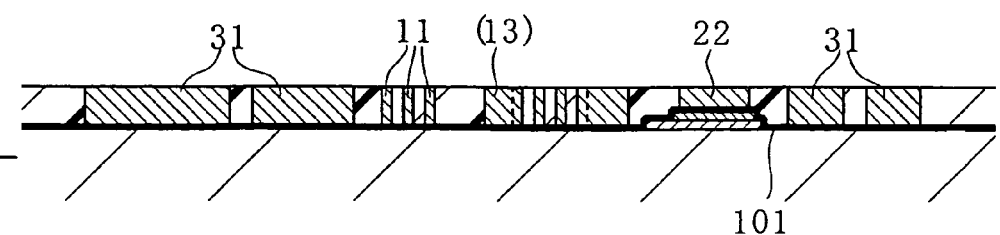

FIG. 21
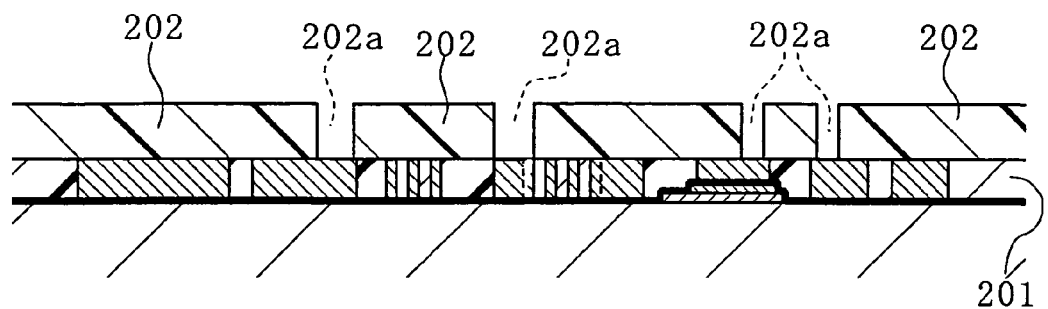
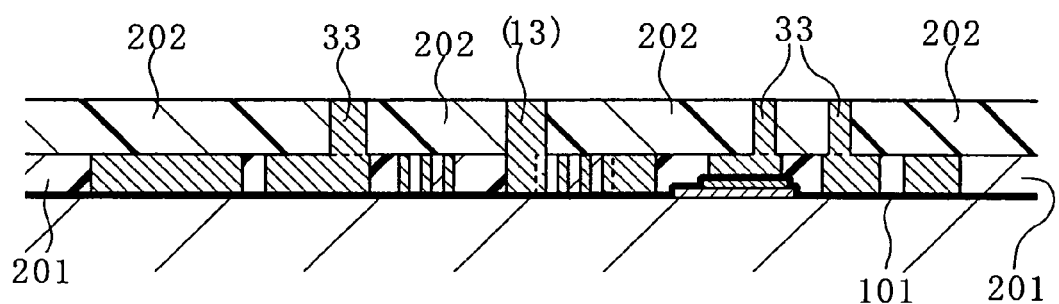
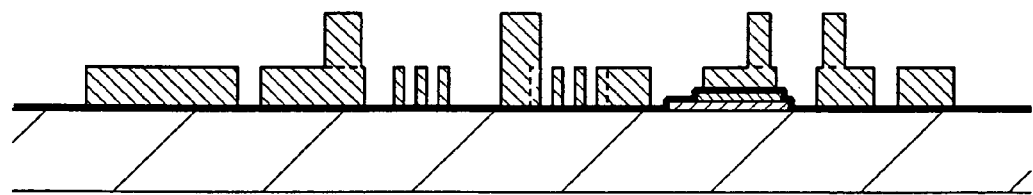
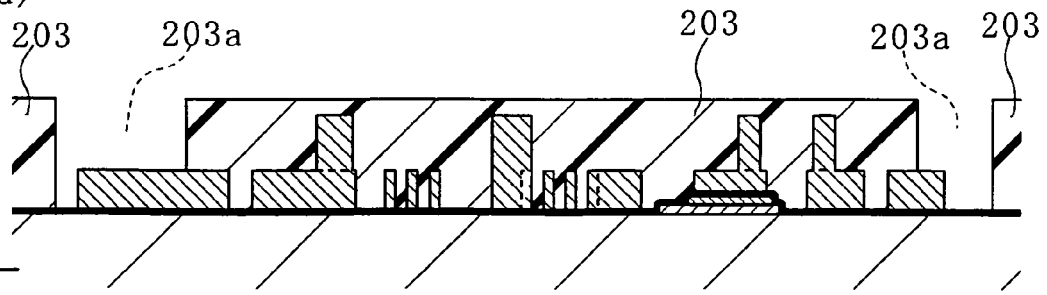

FIG. 25
(a)
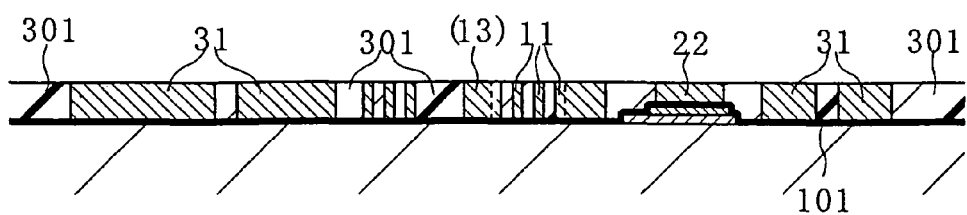
(b)
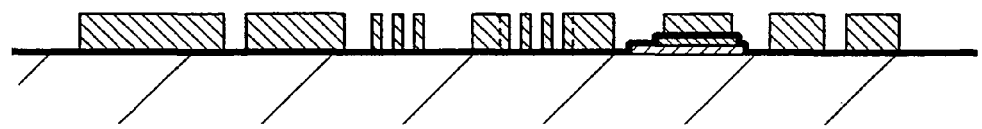
(c)
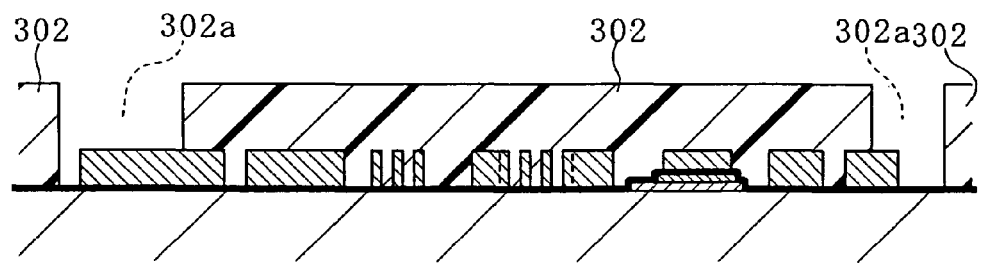
(d)
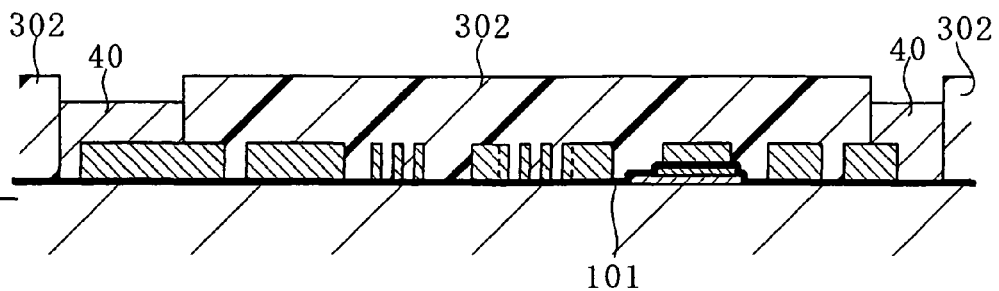

FIG. 26
(a)
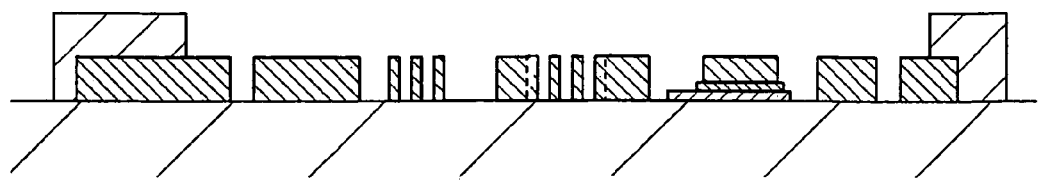
(b)
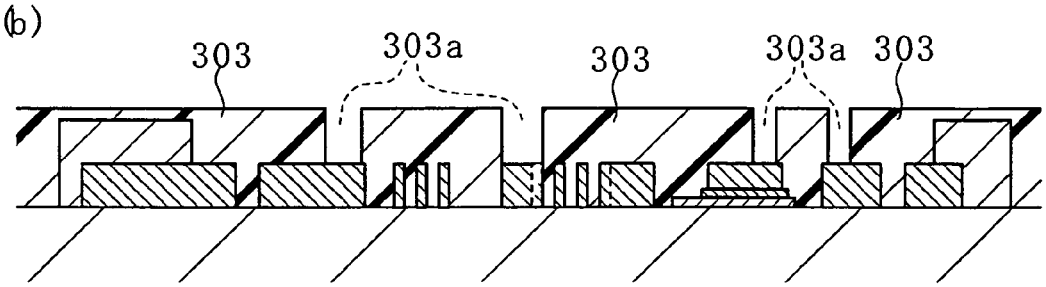
(c)
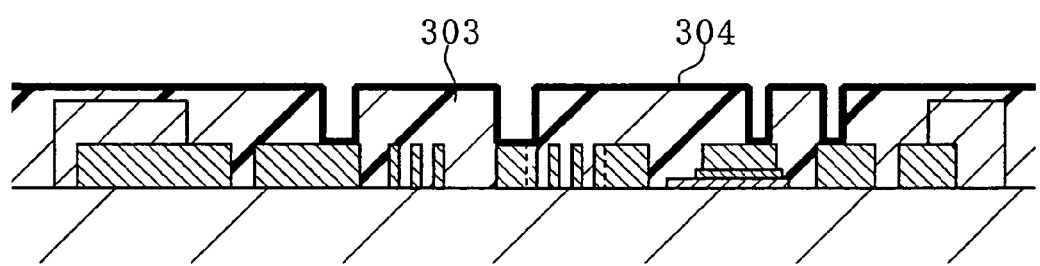
(d)
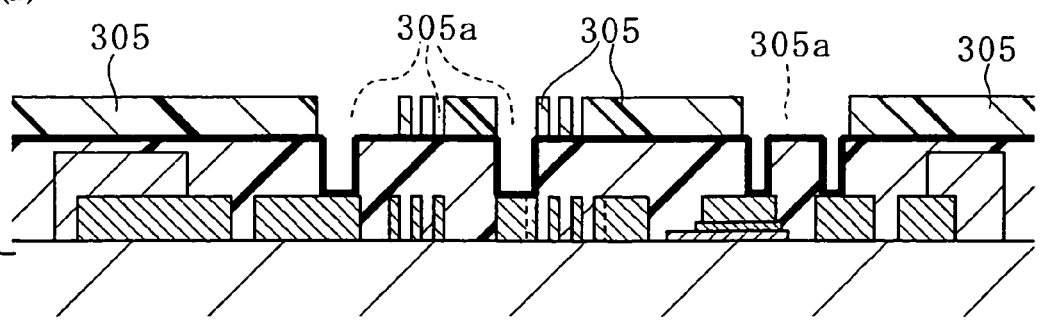

FIG. 30
(a)
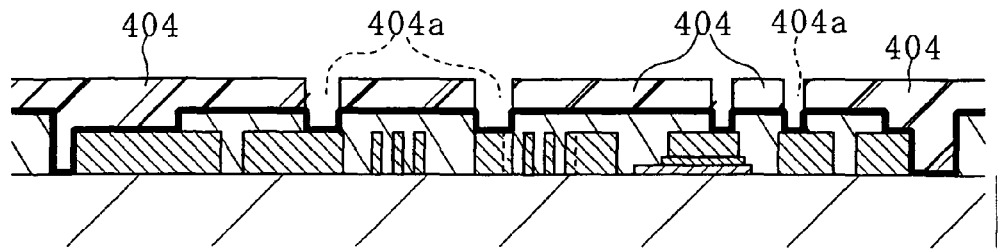
(b)
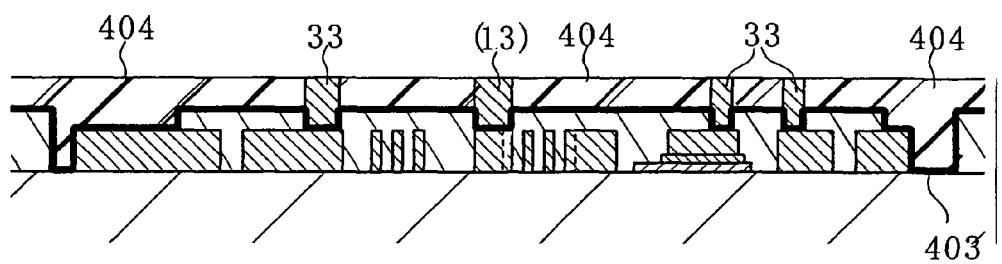
(c)
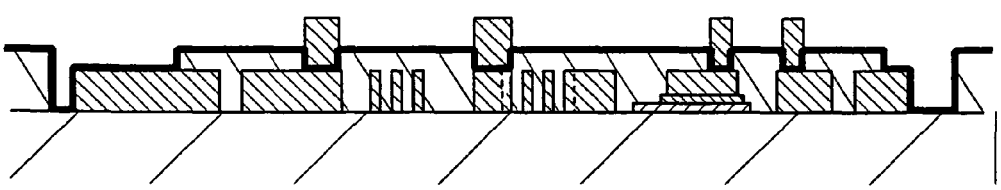
(d)
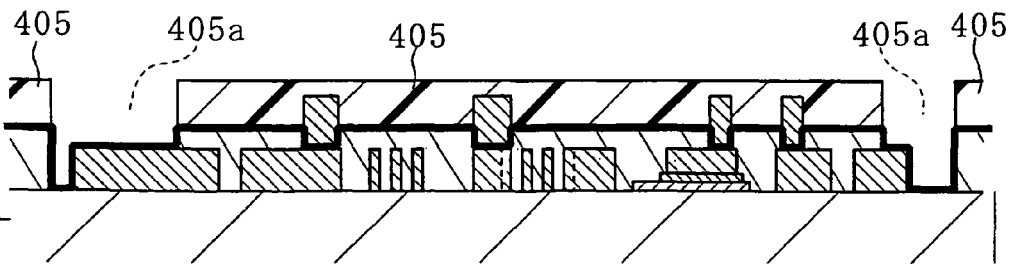

US 8,518,789 B2

INTEGRATED ELECTRONIC DEVICE AND METHOD OF MAKING THE SAME

CROSS REFERENCE TO RELATED APPLICATION

This application is a divisional application of U.S. application Ser. No. 11/509,577, filed Aug. 25, 2006, and claims the right of priority under 35 U.S.C. §119 based on Japanese Patent Application No. 2005-252596 filed on Aug. 31, 2005, which is hereby incorporated by reference herein in its entirety as is fully set forth herein.

BACKGROUND OF THE INVENTION

1. Field of the Invention

The present invention relates to an integrated electronic device provided with a plurality of passive components such as inductors. The present invention also relates to a method of manufacturing such an integrated electronic device.

2. Description of the Related Art

An RF (radio frequency) system or RF circuitry incorporated in e.g. a mobile terminal generally includes an IPD (integrated passive device) functioning as high-frequency module devices in order to achieve high performance, small size, light weight, etc. An IPD incorporates passive components such as inductors, capacitors, resistors and filters. Among these components, inductors tend to have a lower Q factor (quality factor) than e.g. capacitors. When an IPD includes an inductor, the entire IPD is also likely to have a low Q factor. Therefore, there are demands for IPDs with high Q factor. Further, since RF systems have utilized higher frequency bands, IPDs are also required to adapt to those higher frequency bands. These and other technological aspects about the IPDs are disclosed in the following Patent Documents 1 and 2, as well as Non-Patent Documents 1 and 2.

Patent Document 1: JP-A-H04-61264.
Patent Document 2: U.S. Pat. No. 5,370,766.
Non-Patent Document 1: Albert Sutono et al., "IEEE TRANSACTION ON ADVANCED PACKAGING", VOL. 22, No. 3, AUGUST 1999, p. 326-331.
Non-Patent Document 2: Guo Lihui et al., "IEEE ELECTRON DEVICE LETTERS" VOL. 23, No. 8, AUGUST 2002, p. 470-472.

Non-Patent Document 1, for example, teaches an IPD manufactured by LTCC (low-temperature co-fired ceramic) technology. Such an IPD manufactured by LTCC technology includes a multi-layered ceramic substrate provided with a plurality of passive components. In some cases, a plurality of coils are stacked over a plurality of layers in the multi-layered ceramic substrate in order to increase inductance of an inductor. Such a configuration is suitable for increasing the Q factor of the entire IPD because the higher inductance an inductor has, the higher Q factor the inductor tends to have.

Such an IPD manufactured by LTCC technology, however, faces the following drawbacks. Each of the coils in the inductor is surrounded by ceramic, which has a relatively large dielectric constant. Thereby, the inductor is unduly affected by a parasitic capacitance. A large parasitic capacitance affecting the inductor prevents enhancement of the Q factor of the inductor. Accordingly, IPDs manufactured by LTCC do not show a sufficient Q factor in many cases.

Further, a Q factor is frequency dependent in general. The larger the parasitic capacitance is, the more the self-resonant frequency of the inductor and the peak frequency of the Q factor of the inductor shift toward the low frequency side, whereby the high-frequency characteristics of the IPD is deteriorated. Thus, due to the insufficient Q factor, IPDs manufactured by LTCC technology are sometimes prevented from applying to a targeted high-frequency band and achieving a favorable high-frequency characteristic.

SUMMARY OF THE INVENTION

The present invention has been proposed under the above-described circumstances, and it is therefore an object of the present invention to provide an IPD which is suitable for achieving a high Q factor and a good high-frequency characteristic, and a method of manufacturing the IPD.

A first aspect of the present invention provides an integrated electronic device. The integrated electronic device includes a substrate, a plurality of passive components, a plurality of pads for external connection, and three-dimensional wiring. The passive components include a multi-stage coil inductor provided on the substrate. The multi-stage coil inductor has a plurality of coils disposed in a plurality of stages, and mutually adjacent coil wires are spaced-apart from each other. The three-dimensional wiring includes a first wiring portion extending on the substrate, a second wiring portion extending along and off the substrate, and a third wiring portion connecting the first and the second wiring portions. When there is a plurality of the first wiring portion and/or the second wiring portions, electrical connection in a pair of the first and the second wiring portions may or may not be via the third wiring portion, i.e. the connection may be made directly without the third wiring portion.

With regard to the integrated electronic device having such a constitution as the above, the multi-stage coil inductor provided on the substrate can be expressed in an equivalent lumped-constant circuit as shown in FIG. 1, and the Q factor can be expressed in Formula (1) given below. In FIG. 1 and Formula (1), L represents the inductor inductance, Ri represents the inductor resistance, $R_s$ represents the substrate resistance, C represents the inductor parasitic capacitance, and ω represents the angular frequency and is equal to 2πf (f represents the frequency). Formula (1) is expressed as a product of three factors, where the second factor is called the substrate loss factor, and the third factor is called self-resonance factor.

$$Q = \frac{\omega L}{R_i} \cdot \frac{R_s}{R_s + [(\omega L / R_i + 1)] R_i} \cdot \left[1 - \frac{R_i^2 C}{L} - \omega^2 LC\right] \quad (1)$$

The multi-stage coil inductor of the integrated electronic device described above produces large inductance L as an entire inductor because the spiral coils show mutual inductance due to mutual electromagnetic induction between the spiral coils when an AC current is applied. For this reason, according to the multi-stage coil inductor in the present integrated electronic device, a total length of conductive wire necessary for achieving a given inductance L tends to be short (i.e. an inductance L achievable with a given length of conductive wire tends to be large). On the other hand, the shorter is the total length of conductive wire for constituting the multi-stage coil inductor, the smaller the resistance Ri in each of the multi-stage coil inductor tends to be. Therefore, the multi-stage coil inductor according to the present integrated electronic device is suitable for achieving a predetermined inductance L, at a small resistance Ri. As will be understood from the above-mentioned Formula (1) and particularly from the first factor therein, achieving a predetermined inductance L at a small resistance Ri contributes to an increase in the Q factor.

Further, according to the multi-stage coil inductor in the present integrated electronic device, the applied AC current flows in the same direction in the mutually adjacent spiral coils, whereby intensity of the magnetic field generated between the coils is reduced to decrease skin effect of the high frequency current in the coil wires. Therefore, it is possible to lower the resistance Ri (high frequency resistance) of the coil wire. As understood from Formula (1), lowering of the resistance Ri contributes to an increase in the Q factor.

In addition, in the multi-stage coil inductor according to the present integrated electronic device, the coil wire is not surrounded by e.g. ceramic of a significant thickness (which has a large dielectric constant). In particular, there is no such material as ceramic between mutually adjacent coil windings. Therefore, the multi-stage coil inductor is suitable for reducing parasitic capacitance C. As will be understood from Formula (1), lowering of parasitic capacitance C contributes to an increase in the Q factor.

As described, the multi-stage coil inductor according to the present integrated electronic device is suitable for achieving a high Q factor. Therefore, the integrated electronic device which includes the multi-stage coil inductor as described above is suitable for achieving a high Q factor.

Further, the present integrated electronic device is also suitable for achieving a good high-frequency characteristic. Generally, the smaller is the parasitic capacitance of the inductor, the more the inductor's self-resonant frequency and a frequency at which the inductor's Q factor peaks out shift toward the high frequency side, making easier to achieve a good high-frequency characteristic. For this reason, the multi-stage coil inductor which is suitable for decreasing parasitic capacitance C is also suitable for achieving a good high-frequency characteristic. Therefore, the present integrated electronic device which includes such a multi-stage coil inductors as described above is suitable for achieving a good high-frequency characteristic.

In addition, the present integrated electronic device is suitable for reducing loss in the wiring which is used for establishing electrical connections among the passive components and the pads. The present integrated electronic device is provided with a three-dimensional wiring which includes a first wiring portion extending on the substrate in connection therewith, a second wiring portion extending off the substrate and along the substrate, and a third wiring portion connecting with the first and the second wiring portions. When these three kinds of portions are used in appropriate combination, the three-dimensional wiring gives a high degree of freedom in connecting one passive component with another passive component as well as connecting a passive component with a pad. In other words, according to the present integrated electronic device, there is a high degree of freedom in wiring design for connecting the components (passive components and pads) on the substrate. A high degree of freedom in the wiring design is suitable for minimizing the length of wiring between the components, and suitable also for avoiding crossovers between wires as well as between wiring and coil conductors. Minimizing the length of wiring between the components helps lowering high frequency resistance in the wiring. Avoiding crossovers between wires as well as between wiring and coil conductors helps reducing undesirable generation of eddy current in the wiring and/or coil conductors resulting from mutual electromagnetic induction due to the crossover structure. The reduction of high frequency resistance and reduction of eddy current are suitable for reducing loss in the wiring which connects the components. Furthermore, reduction of wiring loss is suitable for achieving a high Q factor in the integrated electronic device X as a whole.

As described thus far, the integrated electronic device according to the first aspect of the present invention is suitable for achieving a high Q factor and a good high-frequency characteristic.

According to a preferred embodiment, the integrated electronic device according to claim 1, wherein the plurality of coils are spiral coils spacing apart from each other via a gap. Such a multi-stage coil inductor as the above enables to increase the number of windings of the coil in the inductor as a whole by increasing the number of coils disposed in the multiple layers as well as by increasing the to number of windings made in the same plane for the spiral coil. Therefore, it is possible to achieve a required inductance L efficiently. Increase in the inductance L helps increasing the Q factor.

According to another preferred embodiment, the integrated electronic device according to claim 1, wherein each of the plurality of coils is a solenoid coil or a toroidal coil. Coils of these types may be used in the present invention.

Preferably, the substrate is selected from a semiconductor substrate, a semiconductor substrate having a surface formed with an insulation film, a quartz substrate, a glass substrate, a piezoelectric substrate, a ceramic substrate, an SOI (silicon on insulator) substrate, an SOQ (silicon on quartz) substrate and an SOG (silicon on glass) substrate. The piezoelectric substrate can be made from such piezoelectric materials as $LiTaO_3$, $LiNbO_3$, AlN, ZnO and piezoelectric ceramics.

The plurality of passive parts according to the present integrated electronic device may include a capacitor and/or a resistor. In addition to the multi-stage coil inductor, the present integrated electronic device can be designed to include capacitors and resistors as the passive components, depending on the desired function.

Preferably, the capacitor has a first electrode and a second electrode opposed to each other. The first electrode is provided on the substrate whereas the second electrode is provided off and along the substrate.

Preferably, the closest coil to the substrate included in the multi-stage coil inductor is spaced apart from the substrate. Such a structure is suitable for reducing induction current generated in the substrate when the electric current is applied to the multi-stage coil inductor. The induction current reduction is particularly significant when the substrate is provided by a conductive material. In the case where the coil of the multi-stage coil inductor which is closest to the substrate is off the substrate, the inductor's mechanical stability may be enhanced by providing a support raised on the substrate to under-prop the inductor.

Preferably, the closest coil to the substrate included in the multi-stage coil inductor is formed as a pattern on the substrate. Such a structure is preferable in view of mechanical stability of the three-dimensional multi-stage coil inductor on the substrate.

Preferably, the passive components include a filter selected from a group consisting of an LCR filter, an SAW filter, an FBAR filter and a mechanical oscillation filter. Examples of the mechanical oscillation filter include micromechanical disc resonators, micromechanical ring resonators and micromechanical beam resonators.

Preferably, the integrated electronic device further includes a resin sealant for sealing the passive components and the three-dimensional wiring on the substrate. In this case, the resin sealant may have a portion entering a space between mutually adjacent coil wires in the multi-stage coil inductor, but the portion does not completely seal the space between the coil wires. A resin sealant is suitable for achieving a high level of reliability in the present integrated electronic device.

Preferably, the multi-stage coil inductor and/or the three-dimensional wiring has a portion coated with a film selected from a group consisting of corrosion-resistant films and magnetic films, or with a multi-layered film including the film. Coating with a corrosion resistant film is suitable for improving corrosion resistance of the coil conductor wire of the multi-stage coil inductor and conductor portions of the three-dimensional wiring. The corrosion resistant film can be formed of different materials. Examples include metals such as Au, Rh and Ru, as well as dielectric materials. Examples of the dielectric materials include resin materials such as BCB (Benzocyclobutenes), PBO (Polybenzoxazoles) and polyimide, as well as non-resin materials such as silicon oxide, silicon nitride and aluminum oxide. On the other hand, coating with a magnetic film is suitable for intensifying the magnetic field generated around the coil conductor wire in particular. Intensifying the magnetic field generated around the coil conductor wire is suitable for increasing the inductance L of the multi-stage coil inductor. The magnetic film should preferably be formed of a high resistance material, in view of reducing eddy current generation within the magnetic film itself. Examples of the material for such a magnetic film include Fe—Al—O alloys and CoFeB—$SiO_2$ high resistance magnetic materials.

Preferably, the coil wire of the multi-stage coil inductor and/or the first through the third conductor portions of the three-dimensional wiring is made of Cu, Au, Ag or Al. It is preferred that the coil wire of the multi-stage coil inductor and the first through the third conductor portions of the three-dimensional wiring multi-stage coil inductor be formed of these low-resistance conductor materials.

Preferably, the substrate has a recess, and the multi-stage coil inductor is provided in the recess. Such an arrangement is suitable for reducing the size of the integrated electronic device.

A second aspect of the present invention provides a method of making an integrated electronic device. The method includes the steps of: forming a lower conductive portion by electroplating; forming a first resist pattern having an opening for formation of an upper conductive portion on the lower conductive portion, allowing part of the lower conductive portion to expose in the opening; forming a seed layer over a surface of the first resist pattern and a surface of the lower conductive portion exposed in the opening; forming a second resist pattern having an opening, on the first resist pattern; forming the upper conductor portion by electroplating, in the opening of the second resist pattern; removing the second resist pattern; removing the seed layer; and removing the first resist pattern. Such a method as the above is suitable for manufacturing the integrated electronic device according to the first aspect.

BRIEF DESCRIPTION OF THE DRAWINGS

FIG. 11 shows steps following the steps in FIG. 10.
FIG. 12 shows steps following the steps in FIG. 11.
FIG. 13 shows steps following the steps in FIG. 12.
FIG. 14 shows steps following the steps in FIG. 13.
FIG. 15 shows steps following the steps in FIG. 14.

FIG. 20 shows a few steps of a method of making the first variation.

FIG. 21 shows steps following the steps in FIG. 20.

FIG. 25 shows steps following the steps in FIG. 24.
FIG. 26 shows steps following the steps in FIG. 25.

FIG. 30 shows steps following the steps in FIG. 29.

DETAILED DESCRIPTION OF THE PREFERRED EMBODIMENT

Figure 2:
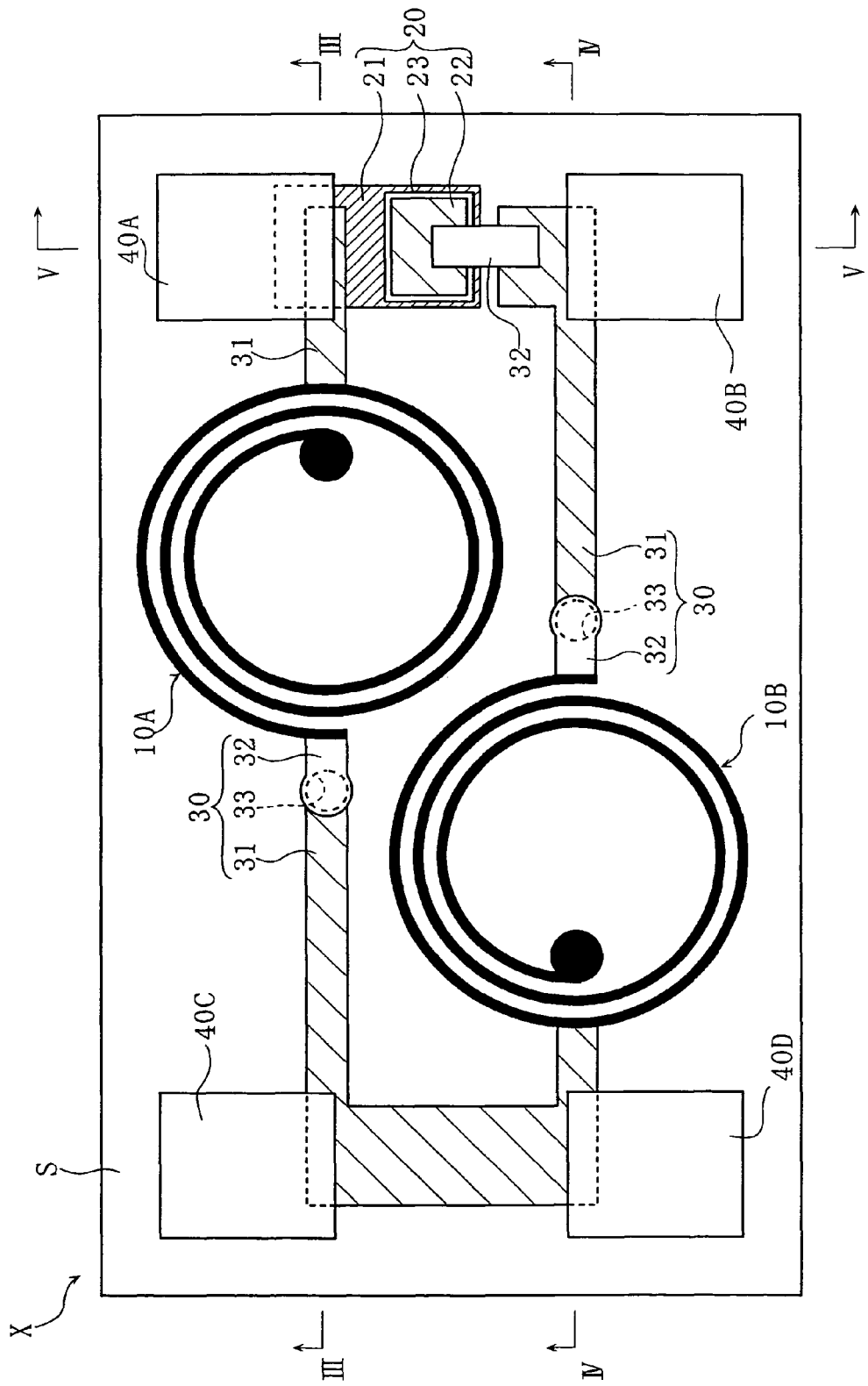
FIG. 2 is a plan view of an integrated electronic device according to the present invention.
Figure 3:
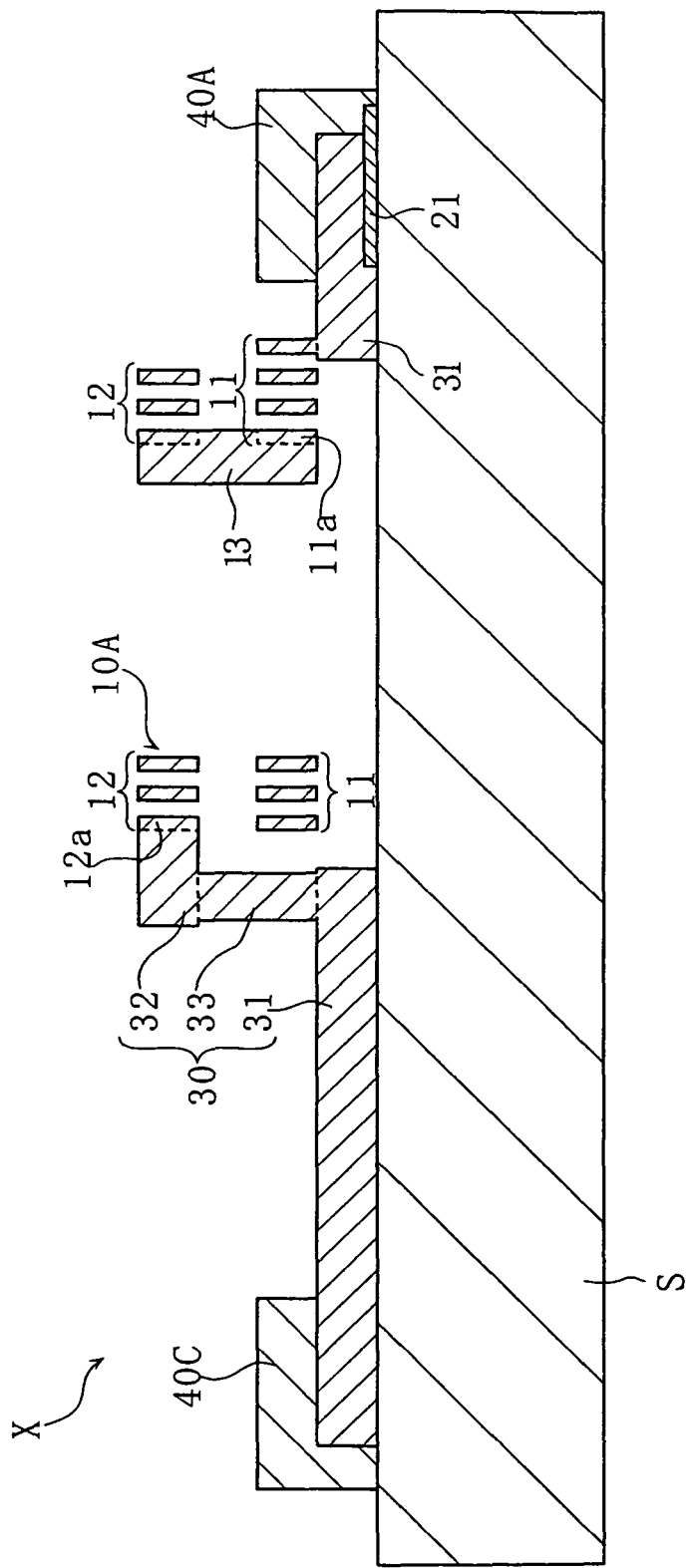
FIG. 3 is a sectional view taken in lines III-III in FIG. 2.
Figure 4:
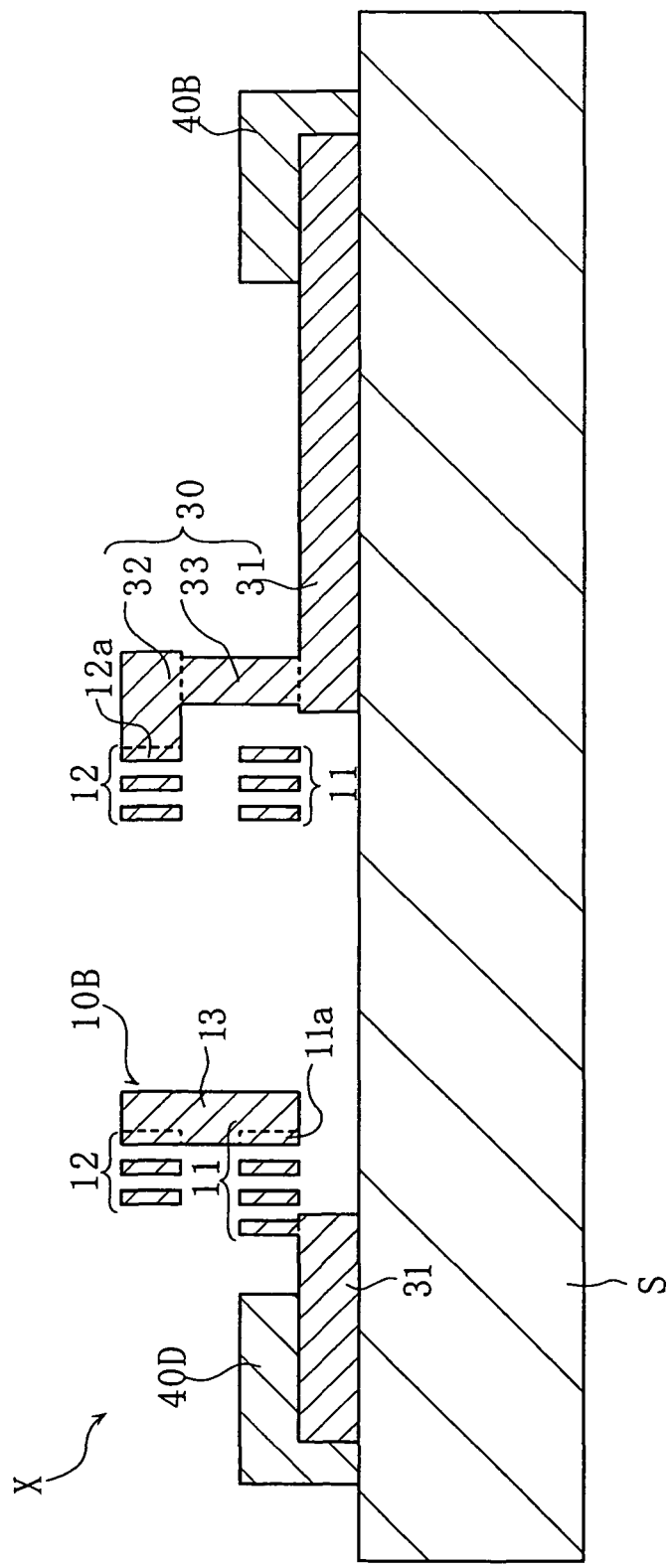
FIG. 4 is a sectional view taken in lines IV-IV in FIG. 2.
Figure 5:
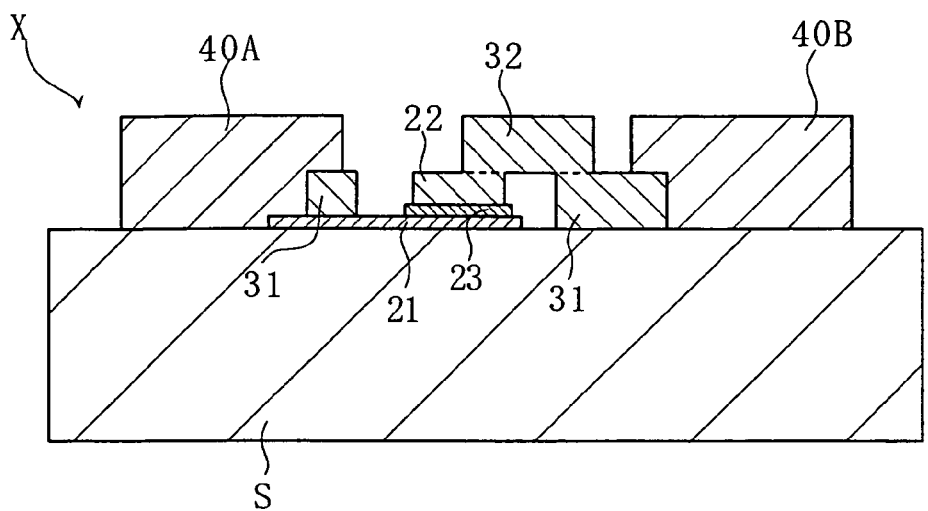
FIG. 5 is a sectional view taken in lines V-V in FIG. 2.

FIG. 2 through FIG. 5 show an integrated electronic device X according to the present invention. FIG. 2 is a plan view of the integrated electronic device X. FIG. 3 through FIG. 5 are sectional views taken in lines III-III, IV-IV, and V-V in FIG. 2 respectively.

Figure 6:
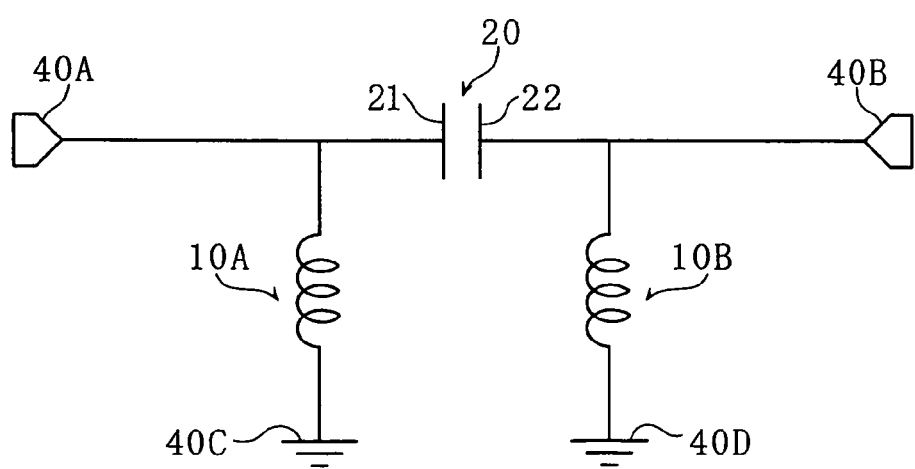
FIG. 6 is a circuit diagram of the integrated electronic device in FIG. 2.

The integrated electronic device X includes a substrate S, multi-stage coil inductors 10A, 10B, a capacitor 20, three-dimensional wiring 30, and pads 40A, 40B, 40C, 40D, constituting a circuit shown in FIG. 6.

The substrate S is provided by a semiconductor substrate, a semiconductor substrate having a surface formed with an insulation film, a quartz substrate, a glass substrate, a piezoelectric substrate, a ceramic substrate, an SOI (silicon on insulator) substrate, a SOQ (silicon on quartz) substrate or an SOG (silicon on glass) substrate. The semiconductor substrate is made up of a silicon material such as monocrystal silicon. The piezoelectric substrate is made up of piezoelectric materials such as $LiTaO_3$, $LiNbO_3$, AlN, ZnO and piezoelectric ceramics.

Figure 7:
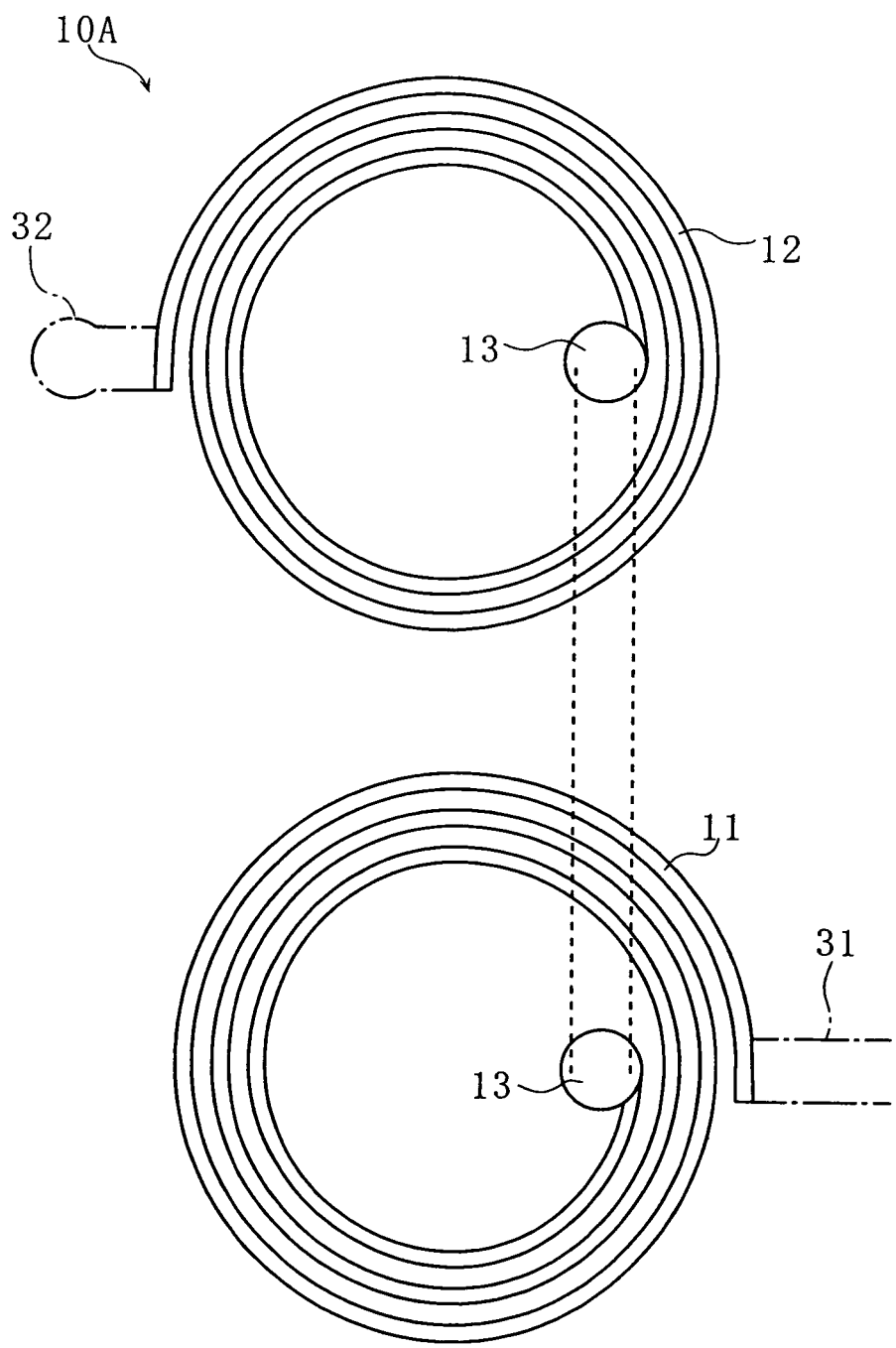
FIG. 7 is an exploded plan view of one of two multi-stage coil inductors.
Figure 8:
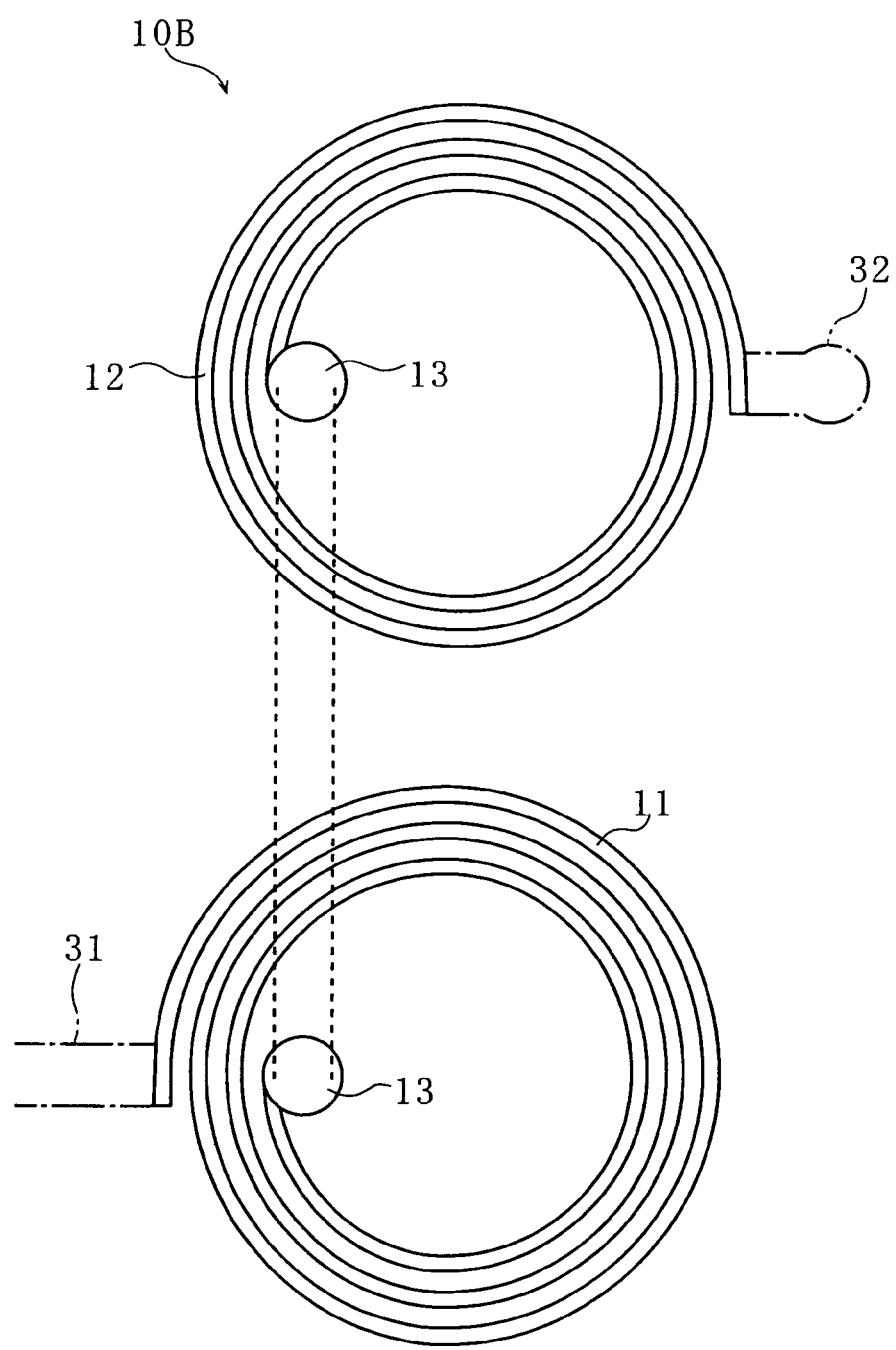
FIG. 8 is an exploded plan view of the other multi-stage coil inductor.

Each of the multi-stage coil inductors 10A, 10B is a kind of passive component and includes, as shown in FIG. 3 and FIG. 4 for example, two-tiered spiral coils 11, 12 and a connecting member 13 which connects these coils with each other in series. In FIG. 2, the multi-stage coil inductors 10A, 10B are represented simply by bold spirals. FIG. 7 is an exploded plan view of the multi-stage coil inductor 10A whereas FIG. 8 is an exploded plan view of the multi-stage coil inductor 10B. In each of the multi-stage coil inductors 10A, 10B, the spiral coils 11, 12 are so wound that the electric current passes through both of the spiral coils in the same direction. In each of the multi-stage coil inductors 10A, 10B, mutually adjacent winding wires are spaced from each other by a gap. The spiral coils 11, 12 preferably have a thickness not smaller than 3 μm. Further, in the present embodiment, the spiral coil 11 is closer to the substrate S than the spiral coil 12, and is spaced from the substrate S. The distance between the spiral coil 11 and the substrate S is e.g. from 1 through 100 μm. The multi-stage coil inductors 10A, 10B are made of Cu, Au, Ag or Al for example.

Figure 1:
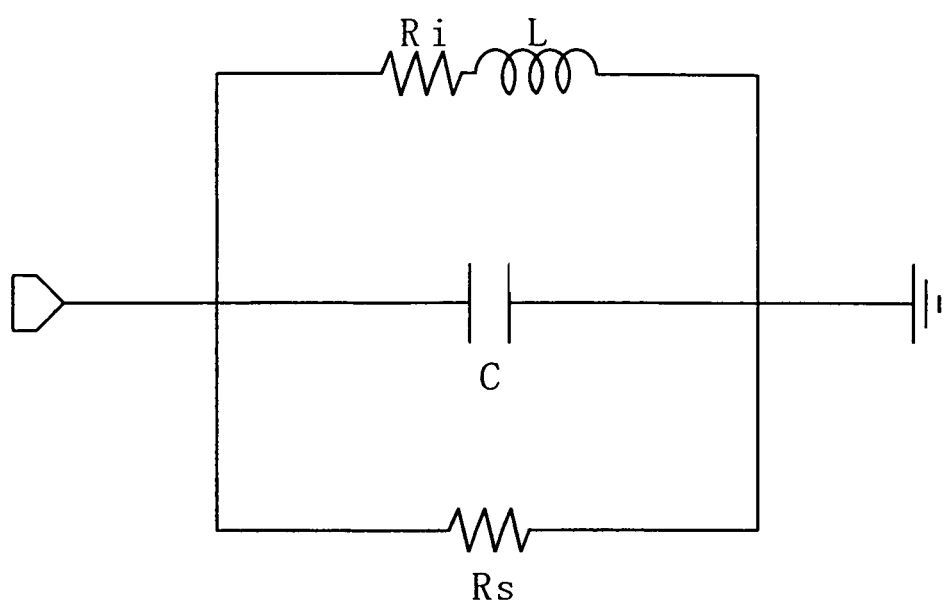
FIG. 1 shows a lumped-constant, equivalent circuit of a multi-stage coil inductor according to the present invention.

Each of the multi-stage coil inductors 10A, 10B provided on the substrate S in the integrated electronic device X is described as an equivalent lumped-constant circuit shown in FIG. 1, and the Q factor is expressed by the above-mentioned Formula (1). In FIG. 1 and Formula (1), as noted above, L represents inductance of the inductor, Ri represents resistance of the inductor, $R_s$ represents resistance of the substrate, C represents parasitic capacitance of the inductor, and w represents the angular frequency and is equal to $2\pi f$ (f: frequency).

The capacitor 20, another kind of passive component, and has a stacked structure shown in FIG. 5, which includes a first electrode 21, a second electrode 22, and a dielectric layer 23 interposed therebetween. The first electrode 21 is provided on the substrate S. The second electrode 22 is spaced from the substrate S and disposed along the substrate S. The second electrode 22 has a thickness preferably not smaller than 3 μm. Further, the first electrode 21 has a predetermined multilayered structure for example, in which each of the layers contains a metal selected from Cu, Au, Ag and Al. The second electrode 22 is made of Cu, Au, Ag or Al for example. The dielectric layer 23 is made of silicon oxide, silicon nitride, aluminum oxide, tantalum oxide or titanium oxide for example.

The three-dimensional wiring 30, which is a wiring for establishing electrical connection among the components (the passive components and the pads) on the substrate, includes a first wiring portion 31 which has a part extending on the substrate S, a second wiring portion 32 which extends off the substrate S and along the substrate S, and a third wiring portion 33 which connects with the first wiring portion 31 and the second wiring portion 32. For the sake of illustrative clarity, only the first wiring portion 31 of the three-dimensional wiring 30 is hatched in FIG. 2. The three-dimensional wiring 30 is made of Cu, Au, Ag, or Al for example. The first wiring portion 31 and the second wiring portion 32 have a thickness preferably not smaller than 3 μm.

The pads 40A through 40D are electric pads for external connection. As will be understood from FIG. 6, the pads 40A, 40B serves as input/output terminals for electric signals, and the pads 40C, 40D are grounded. The pads 40A through 40D are made of e.g. a piece of Ni having its upper surface coated with a film of Au.

As shown in FIG. 6, the multi-stage coil inductor 10A is electrically connected with the pads 40A, 40C and the first electrode 21 of the capacitor 20. Specifically, as shown in FIG. 3, in the multi-stage coil inductor 10A, the lower spiral coil 11 in the figure has an end 11a which is electrically connected with the pad 40A and the first electrode 21 of the capacitor 20 via the first wiring portion 31, whereas the upper spiral coil 12 in the figure of the multi-stage coil inductor 10A has an end 12a which is electrically connected with the pad 40C via the second wiring portion 32, the third wiring portion 33 and the first wiring portion 31.

As shown in FIG. 6, the multi-stage coil inductor 10B is electrically connected with the pads 40B, 40D and the second electrode 22 of the capacitor 20. Specifically, as shown in FIG. 4 and FIG. 5, in the multi-stage coil inductor 10B, the upper spiral coil 12 in the figure has an end 12a which is electrically connected with the pad 40B via the second wiring portion 32, the third wiring portion 33 and the first wiring portion 31, and further, connected with the second electrode 22 of the capacitor 20 via the second wiring portion 32. Further, in the multi-stage coil inductor 10B, the lower spiral coil 11 in the figure has an end 11a which is electrically connected with the pad 40D via the first wiring portion 31.

The multi-stage coil inductors 10A, 10B of the integrated electronic device X described above produce large inductance L as an entire inductor because the spiral coils 11, 12 show mutual inductance due to mutual electromagnetic induction between the spiral coils 11, 12 when an AC current is applied. For this reason, according to the multi-stage coil inductors 10A, 10B, a total length of conductive wire for constituting the inductor which gives a predetermined inductance L tends to be short. On the other hand, the shorter is the total length of conductive wire for constituting each of the multi-stage coil inductors 10A, 10B, the smaller the resistance Ri in each of the multi-stage coil inductors 10A, 10B tends to be. Therefore, the multi-stage coil inductors 10A, 10B are suitable for achieving a predetermined inductance L, at a small resistance Ri. As will be understood from the above-mentioned formula (1) and particularly from the first factor therein, achieving a predetermined inductance L at a small resistance Ri contributes to an increase in the Q factor.

Figure 9:
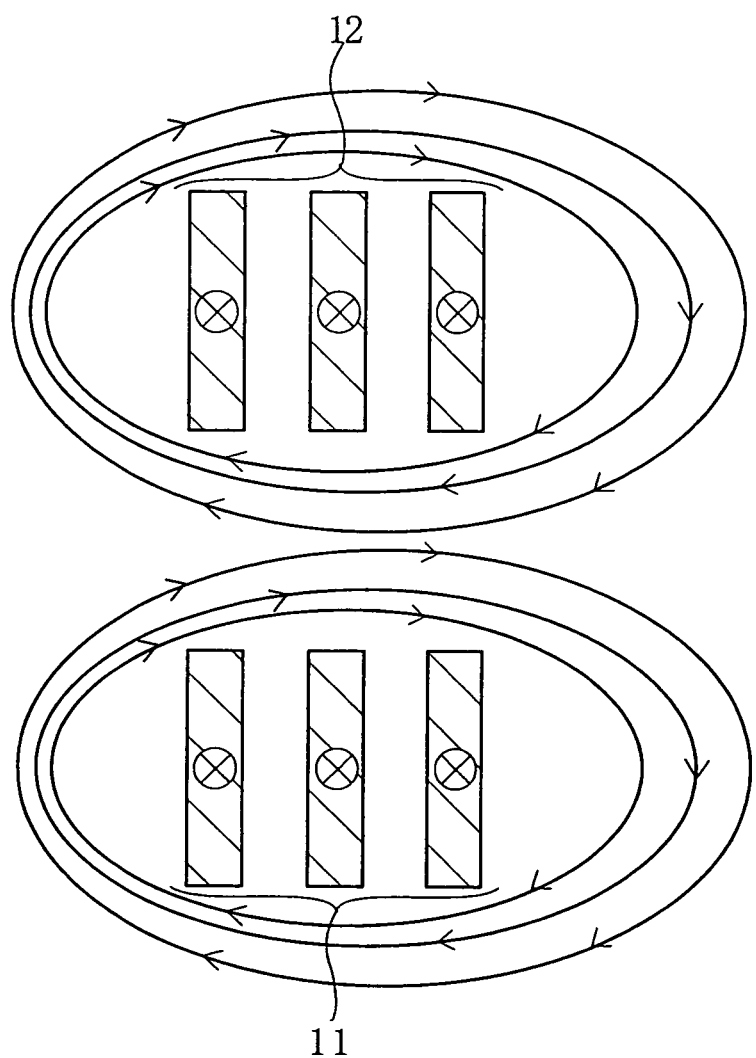
FIG. 9 is a conceptual diagram showing magnetic flux distribution around coil wires.
Figure 10:
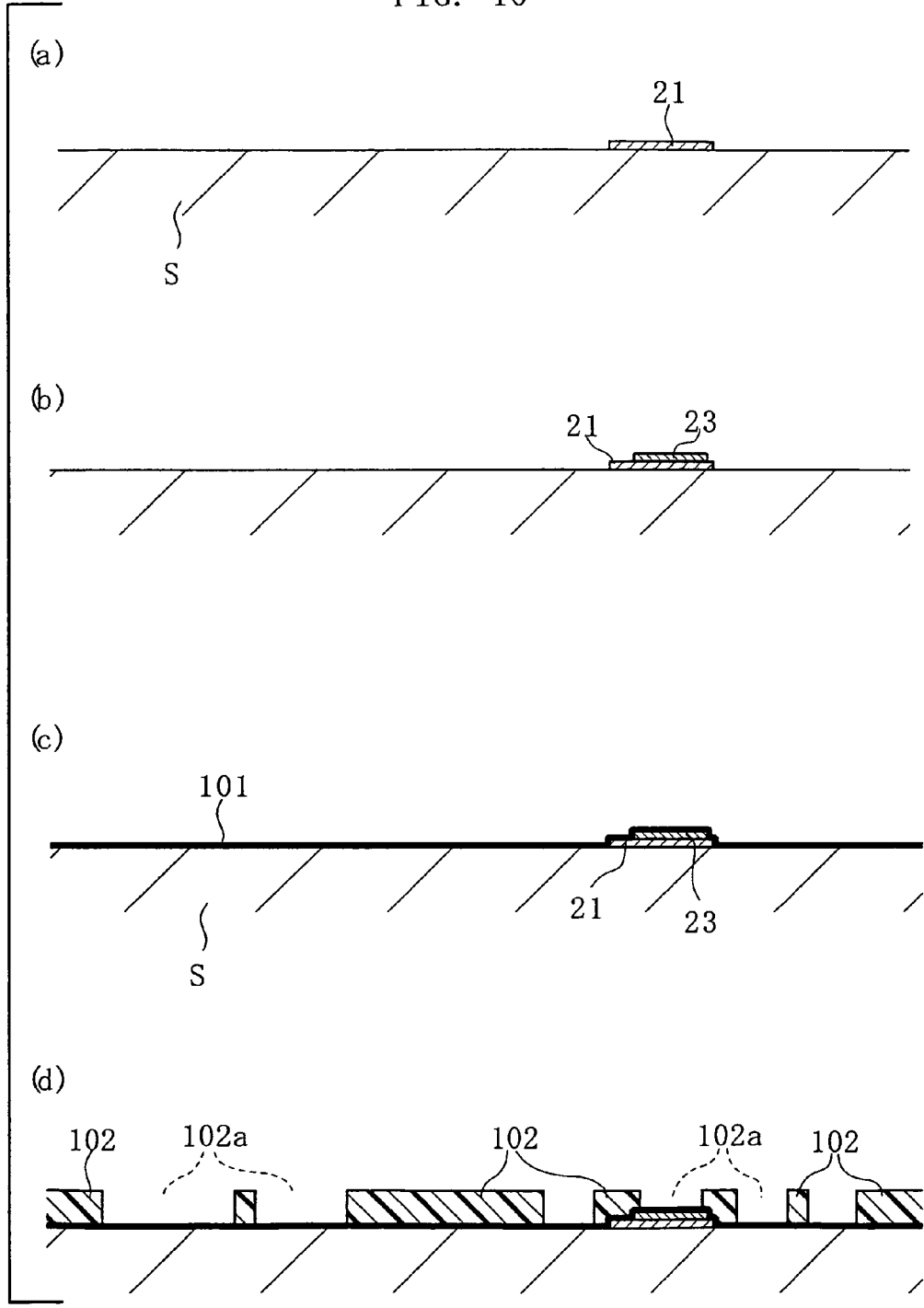
FIG. 10 shows a few steps of a method of making an integrated electronic device according to the present invention.

Further, in each of the multi-stage coil inductors 10A, 10B of the integrated electronic device X, the applied AC current flows in the same direction in the spiral coils 11, 12 as shown in FIG. 9, which enables to reduce intensity of the magnetic field generated between the coils (because a magnetic field generated around the spiral coil 11 by the current flowing through the spiral coil 11 and a magnetic field generated around the spiral coil 12 by the current flowing through the spiral coil 12 cancel each other between the spiral coils 11, 12). This enables to decrease skin effect of the high frequency current in the coil wire of the spiral coils 11, 12, and therefore to lower the resistance Ri (high frequency resistance) of the coil wire. As understood from Formula (1) described earlier, lowering of the resistance Ri contributes to an increase in the Q factor.

In addition, in neither of the multi-stage coil inductors 10A, 10B in the integrated electronic device X, is the coil wire surrounded by e.g. ceramic of a significant thickness (which has a large dielectric constant). In particular, there is no such material as ceramic between mutually adjacent coil windings. Therefore, each of the multi-stage coil inductors 10A, 10B is suitable for reducing parasitic capacitance C. As will be understood from Formula (1), lowering of parasitic capacitance C contributes to an increase in the Q factor.

As described, the multi-stage coil inductors 10A, 10B in the integrated electronic device X are suitable for achieving a high Q factor. Therefore, the integrated electronic device X which includes the multi-stage coil inductors 10A, 10B as described above is suitable for achieving a high Q factor.

Further, the integrated electronic device X is also suitable for achieving a good high-frequency characteristic. Generally, the smaller is the parasitic capacitance of the inductor, the more the inductor's self-resonant frequency and a frequency at which the inductor's Q factor peaks out shifts toward the high frequency side, making easier to achieve a good high-frequency characteristic. For this reason, the multi-stage coil inductors 10A, 10B which are suitable for decreasing parasitic capacitance C are also suitable for achieving a good high-frequency characteristic. Therefore, the integrated electronic device X which includes the multi-stage coil inductors 10A, 10B as described above is suitable for achieving a good high-frequency characteristic.

In addition, the integrated electronic device X is suitable for reducing loss in the wiring which is used for establishing electrical connections among the components (the passive components and the pads). The integrated electronic device X has three-dimensional wiring 30 including a first wiring portion 31 which has a part extending on the substrate S in connection therewith, a second wiring portion 32 which extends off the substrate S and along the substrate S, and a third wiring portion 33 which connects with the first wiring portion 31 and the second wiring portion. When these three kinds of portions are used in appropriate combination, the three-dimensional wiring 30 gives a high degree of freedom in connecting the components. In other words, according to the integrated electronic device X, there is a high degree of freedom in wiring design for connection of the components on the substrate S. A high degree of freedom in the wiring design is suitable for minimizing the length of wiring between the components, and suitable also for avoiding crossovers between wires as well as between wiring and coil conductors. Minimizing the length of wiring between the components helps lowering high frequency resistance in the wiring. Avoiding crossovers between wires as well as between wiring and coil conductors helps reducing undesirable generation of eddy current in the wiring and/or coil conductors resulting from mutual electromagnetic induction due to the crossover structure. The reduction of high frequency resistance and reduction of eddy current are suitable for reducing loss in the wiring which must be made for connecting the components. Furthermore, reduction of wiring loss is suitable for achieving a high Q factor in the integrated electronic device X as a whole.

As described thus far, the integrated electronic device X is suitable for achieving a high Q factor and good high-frequency characteristics.

Further, in the multi-stage coil inductors 10A, 10B according to the present embodiment, a total number of windings of the coil in the inductor as a whole can be changed by increasing or decreasing the number of tiered spiral coils 11, 12 as well as by changing the number of windings made in the same plane for the spiral coils 11, 12. Therefore, it is possible to achieve a required inductance L efficiently.

In addition, according to the present embodiment, the spiral coil 11 in each of the multi-stage coil inductors 10A, 10B, which is the coil closest to the substrate, is spaced from the substrate S. Such a structure is suitable for reducing induction current generated in the substrate S when the electric current is applied to the multi-stage coil inductors 10A, 10B.

FIG. 10 through FIG. 15 show a method of making the integrated electronic device X. This is a method for manufacturing the integrated electronic device X by using bulk micromachining technology. Throughout FIG. 10 to FIG. 15, views of a section will be given to illustrate a process of forming components which are shown in FIG. 15(c), i.e. a multi-stage coil inductor 10, a capacitor 20, two pads 40, and a three-dimensional wiring 30 as well as how they are connected. The section includes a plurality of regions included in a single block of a material substrate from which a single integrated electronic device is formed. The series of sectional views are illustrative sequential depictions. The multi-stage coil inductor 10 represents the multi-stage coil inductors 10A, 10B, and the pad 40 represents the pads 40A through 40D.

In the manufacture of the integrated electronic device X, first, as shown in FIG. 10(a), a first electrode 21 of the capacitor 20 is formed on a substrate S. The first electrode 21 can be formed for example, by first forming a film of a predetermined metal on the substrate S by sputtering, and then patterning the metal film by wet etching or dry etching.

Next, as shown in FIG. 10(b), a dielectric layer 23 of the capacitor 20 is formed on the first electrode 21. The dielectric layer 23 can be formed for example, by first forming a film of a predetermined dielectric material at least on the first electrode 21 by sputtering, and then patterning the dielectric film using a predetermined wet etching or dry etching.

Next, as shown in FIG. 10(c), a seed layer 101 (indicated by a thick solid line) for electroplating is formed on the substrate S, covering the first electrode 21 and the dielectric layer 23. The seed layer 101 has a laminate structure provided by a combination of e.g. a film of Ti and a film of Au formed thereon, a film of Cr and a film of Au formed thereon, a film of Ti and a film of Cu formed thereon, or a film of Cr and a film of Cu formed thereon. The seed layer 101 can be formed by vapor deposition or sputtering for example. Other seed layers to be described later have the same construction and can be formed by using the same method as for the seed layer 101.

Next, as shown in FIG. 10(d), a resist pattern 102 for forming a first-tier thick conductor is formed. In the present method, the first-tier thick conductor provides the second electrode 22 of the capacitor 20 and the first wiring portion 31 of the three-dimensional wiring 30. The resist pattern 102 has openings 102a corresponding to the pattern of the second electrode 22 and of the first wiring portion 31. When forming the resist pattern 102, first, a film of liquid photo-resist is formed on the substrate S by spin coating from above the first electrode 21 and the dielectric layer 23. Next, the photo-resist film is patterned through an exposure process and a development process thereafter. Examples of the photo-resist include AZP 4210 (made by AZ Electronic Materials) and AZ 1500 (made by AZ Electronic Materials). Other resist patterns to be described later can also be formed through the same steps of photo-resist film formation process as described, i.e. an exposure process and a development process.

Next, as shown in FIG. 11(a), the first-tier thick conductor (the second electrode 22 and the first wiring portion 31) is formed by electroplating method, in the openings 102a of the resist pattern 102. During the electroplating process, electricity is applied to the seed layer 101.

Next, as shown in FIG. 11(b), the resist pattern 102 is removed with e.g. a remover. The remover may be AZ Remover 700 (made by AZ Electronic Materials). Note that resist patterns to be described later can also be removed by the same method as used for the resist pattern 102.

Next, as shown in FIG. 11(c), a resist pattern 103 is formed for forming the pads. The resist pattern 103 has openings 103a each corresponding to the pattern of one pad 40.

Next, as shown in FIG. 11(d), the pads 40 are formed by electroplating method, in the openings 103a of the resist pattern 103. During the electroplating process, electricity is applied to the seed layer 101. Each of the pads 40 is preferably provided by a piece of Ni having its upper surface coated with a film of Au.

Next, as shown in FIG. 12(a), the resist pattern 103 is removed, and after the removal, exposed portions of the seed layer 101 are removed. (Note that non-exposed portions of the seed layer 101 are not illustrated in FIG. 12(a) or the figures thereafter). The removal of the seed layer 101 can be accomplished by e.g. ion milling method. Note that seed layers can also be removed by ion milling method as will be described later.

Next, as shown in FIG. 12(b), a resist pattern 104 is formed. The resist pattern 104 serves as a sacrifice layer for forming a second-tier thick conductor on the first-tier thick conductor, and has openings 104a corresponding to the pattern of the first-tier thick conductor. In the present method, the second-tier thick conductor provides the spiral coil 11 of the multi-stage coil inductor 10, as well as the second wiring portion 32 and a third wiring portion 33 of the three-dimensional wiring 30. The resist pattern 104 is formed so that part of the first-tier thick conductor (the second electrode 22 and the first wiring portion 31) is exposed in the openings 104a. It should be noted here that the sacrifice layer according to the present invention, which is provided by a resist pattern in the present embodiment, may not necessarily be formed of a resist material but may be formed of an alternative material which can be patterned and removed, (and this also applies to other sacrifice layers to be described later).

Next, as shown in FIG. 12(c), a seed layer 105 (indicated by a thick solid line) is formed to cover the surface of the resist pattern 104, surfaces of the first-tier thick conductor exposed in the openings 104a and surfaces of the pads 40.

Next, as shown in FIG. 12(d) a resist pattern 106 is formed for forming the second-tier thick conductor. The resist pattern 106 has openings 106a corresponding to the spiral coil 11 and part of the connecting member 13 of the multi-stage coil inductor 10 as well as the second wiring portion 32 and part of the third wiring portion 33 of the three-dimensional wiring 30.

Next, as shown in FIG. 13(a), the second-tier thick conductor (the spiral coil 11, the part of connecting member 13, the second wiring portion 32, and the part of third wiring portion 33) is formed by electroplating method, in the openings 106a of the resist pattern 106. During the electroplating process, electricity is applied to the seed layer 105.

Next, as shown in FIG. 13(b), a resist pattern 107 is formed on the resist pattern 106, for forming a third-tier thick conductor. In the present method, the third-tier thick conductor provides part of the connecting member 13 in the multi-stage coil inductor 10, and part of the third wiring portion 33 of the three-dimensional wiring 30. The resist pattern 107 has openings 107a corresponding to the part of connecting member 13 and the part of the third wiring portion 33.

Next, as shown in FIG. 13(c), the third-tier thick conductor (the part of connecting member 13 and the part of third wiring portion 33) is formed by electroplating method, in the openings 107a of the resist pattern 107. During the electroplating process, electricity is applied to the seed layer 105.

Next, as shown in FIG. 13(d), the resist patterns 106, 107 are removed, and after the removal, exposed portions of the seed layer 105 are removed (Note that non-exposed portions of the seed layer 105 are not illustrated in FIG. 13(d) or the figures thereafter). After this step, the resist pattern 104 is removed as shown in FIG. 14(a).

Next, as shown in FIG. 14(b), a resist pattern 108 is formed. The resist pattern 108 serves as a sacrifice layer for forming a fourth-tier thick conductor on the third-tier thick conductor, and has openings 108a corresponding to the pattern of the third-tier thick conductor. In the present method, the fourth-tier thick conductor provides the spiral coil 12 and part of the connecting member 13 in the multi-stage coil inductor 10, as well as the second wiring portion 32 of the three-dimensional wiring 30. Further, the resist pattern 108 is formed so that part of the third-tier thick conductor is exposed in the openings 108a.

Next, as shown in FIG. 14(c), a seed layer 109 (indicated by a thick solid line) is formed to cover the surface of the resist pattern 108 and surfaces of the third-tier thick conductor exposed in the openings 108a.

Next, as shown in FIG. 14(d), a resist pattern 110 is formed for forming the fourth-tier thick conductor. The resist pattern 110 has openings 110a corresponding to the pattern of the spiral coil 12 and the part of connecting member 13 in the multi-stage coil inductor 10 as well as the second wiring portion 32 of the three-dimensional wiring 30.

Next, as shown in FIG. 15(a), the fourth-tier thick conductor (the spiral coil 12, the part of connecting member 13, and the second wiring portion 32) is formed by electroplating method, in the openings 110a of the resist pattern 110. During the electroplating process, electricity is applied to the seed layer 109.

Next, as shown in FIG. 15(b), the resist pattern 110 is removed, and after the removal, exposed portions of the seed layer 109 are removed (Note that non-exposed portions of the seed layer 109 are not illustrated in FIG. 15(b) or the figures thereafter). Thereafter, the resist pattern 108 is removed as shown in FIG. 15(c).

After the removal of the resist pattern 108, preferably, exposed portions of the multi-stage coil inductor 10 and/or those of the three-dimensional wiring 30 are coated with a film selected from corrosion resistant films and magnetic films, or the coating is made with a multi-layered film which includes the selected film. Coating with a corrosion resistant film is suitable for improving corrosion resistance of the coil conductor wire of the multi-stage coil inductor and conductor portions of the three-dimensional wiring. The corrosion resistant film can be formed of different materials. Examples include metals such as Au, Rh and Ru, as well as dielectric materials. Examples of the dielectric materials include resin materials such as BCB (Benzocyclobutenes), PBO (Polybenzoxazoles) and polyimide, as well as non-resin materials such as silicon oxide, silicon nitride and aluminum oxide. On the other hand, coating with a magnetic film is suitable for intensifying the magnetic field generated around the coil conductor wire in particular. Intensifying the magnetic field generated around the coil conductor wire is suitable for increasing the inductance L of the multi-stage coil inductor. The magnetic film should preferably be formed of a high resistance material, in view of reducing eddy current generation within the magnetic film itself. Examples of the material for such a magnetic film include Fe—Al—O alloys and CoFeB—$SiO_2$ high resistance magnetic materials.

By the steps described thus far as the above, it is possible to form a multi-stage coil inductor 10, a capacitor 20, a three-dimensional wiring 30, and pads 40 on a substrate S, and thereby to manufacture an integrated electronic device X.

Figure 16:
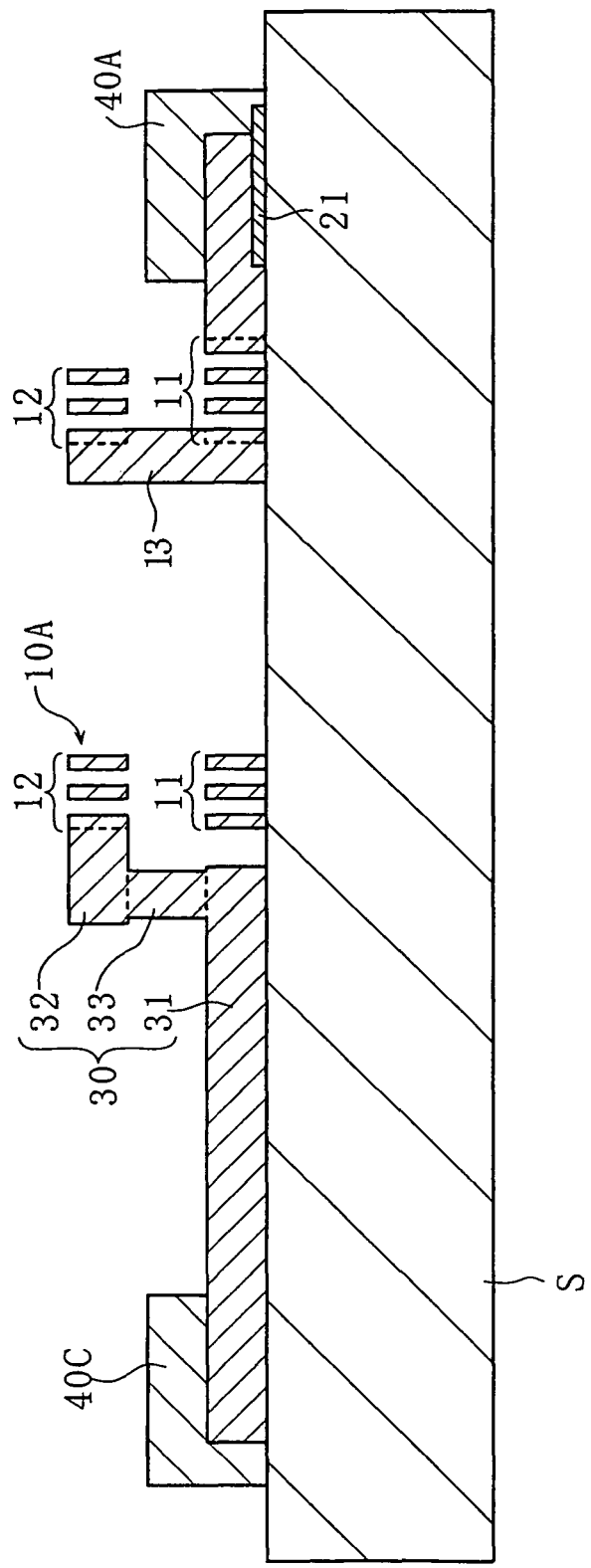
FIG. 16 is a sectional view of a first variation of the integrated electronic device in FIG. 2. The sectional view is comparable to FIG. 3 of the integrated electronic device shown in FIG. 2.
Figure 17:
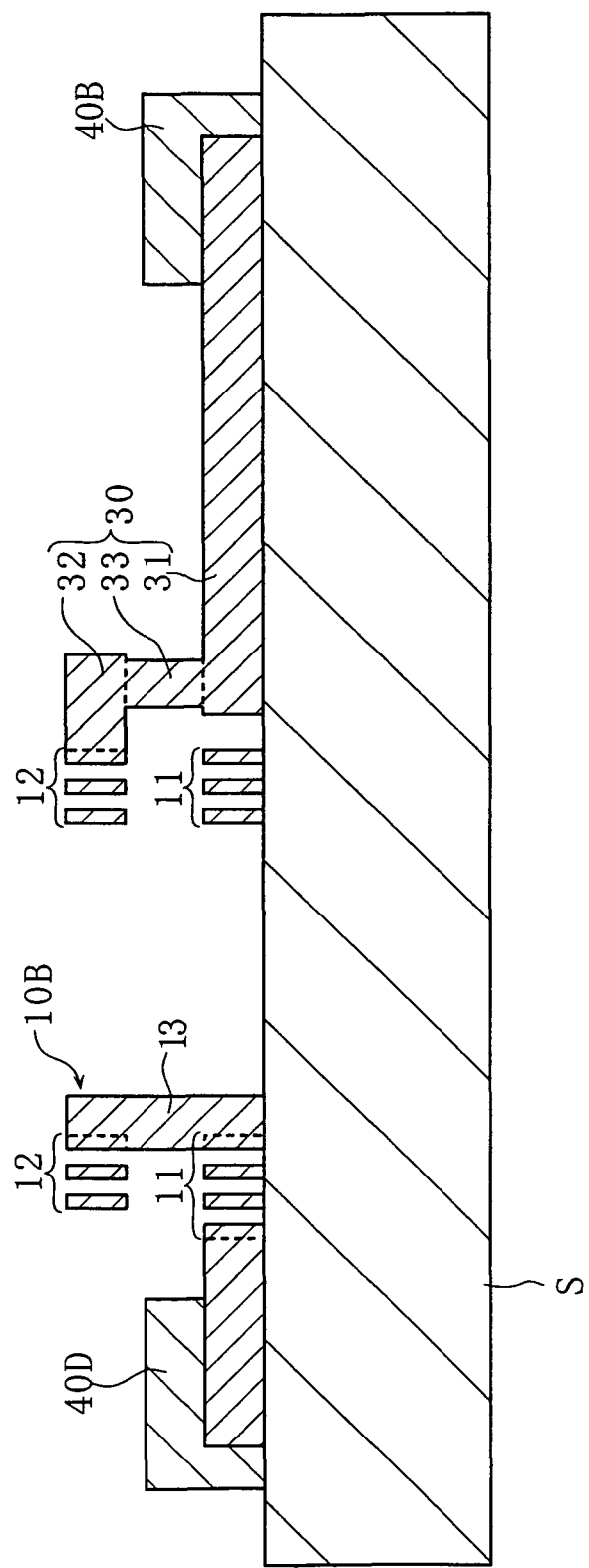
FIG. 17 is another sectional view of the first variation of the integrated electronic device in FIG. 2. The sectional view is comparable to FIG. 4 of the integrated electronic device shown in FIG. 2.

As shown in FIG. 16 and FIG. 17, multi-stage coil inductors 10A, 10B in an integrated electronic device X may be in contact with the substrate S (First Variation). In this case, the three-dimensional wiring 30 may have different dimensions and shapes from those used in the above-described embodiment, to match the height of the spiral coils 11, 12 in each of the multi-stage coil inductors 10A, 10B.

Figure 18:
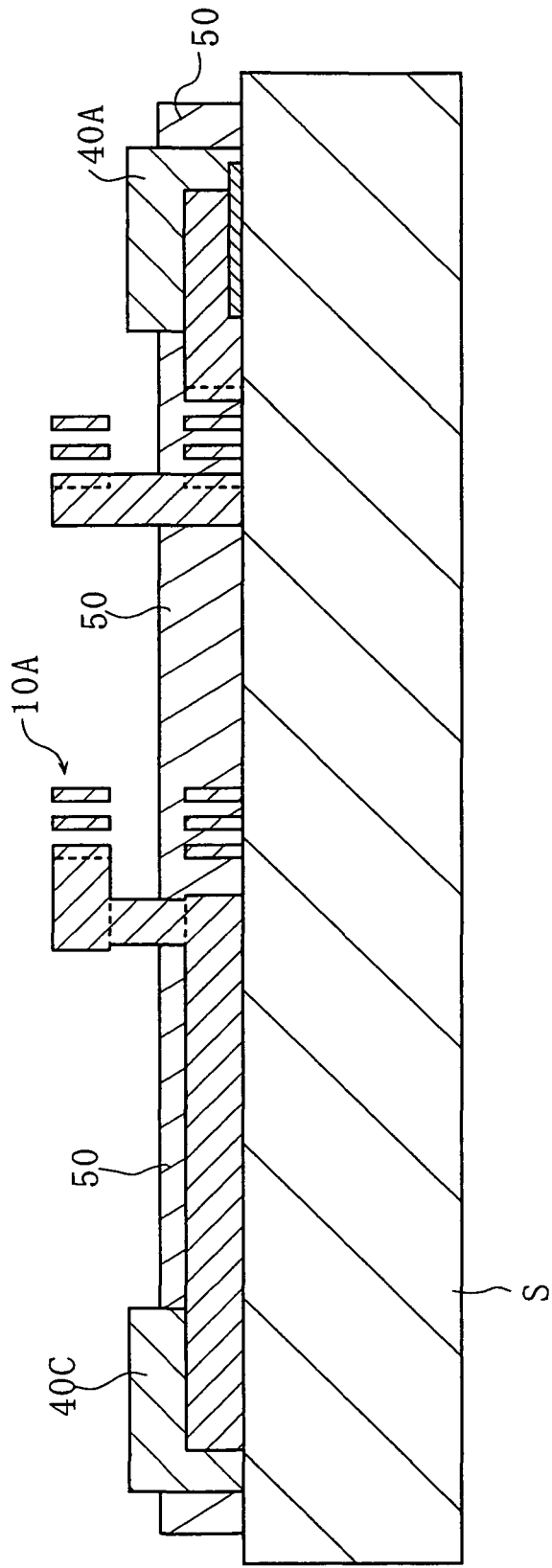
FIG. 18 is a sectional view of a second variation of the integrated electronic device in FIG. 2. The sectional view is comparable to FIG. 3 of the integrated electronic device shown in FIG. 2.
Figure 19:
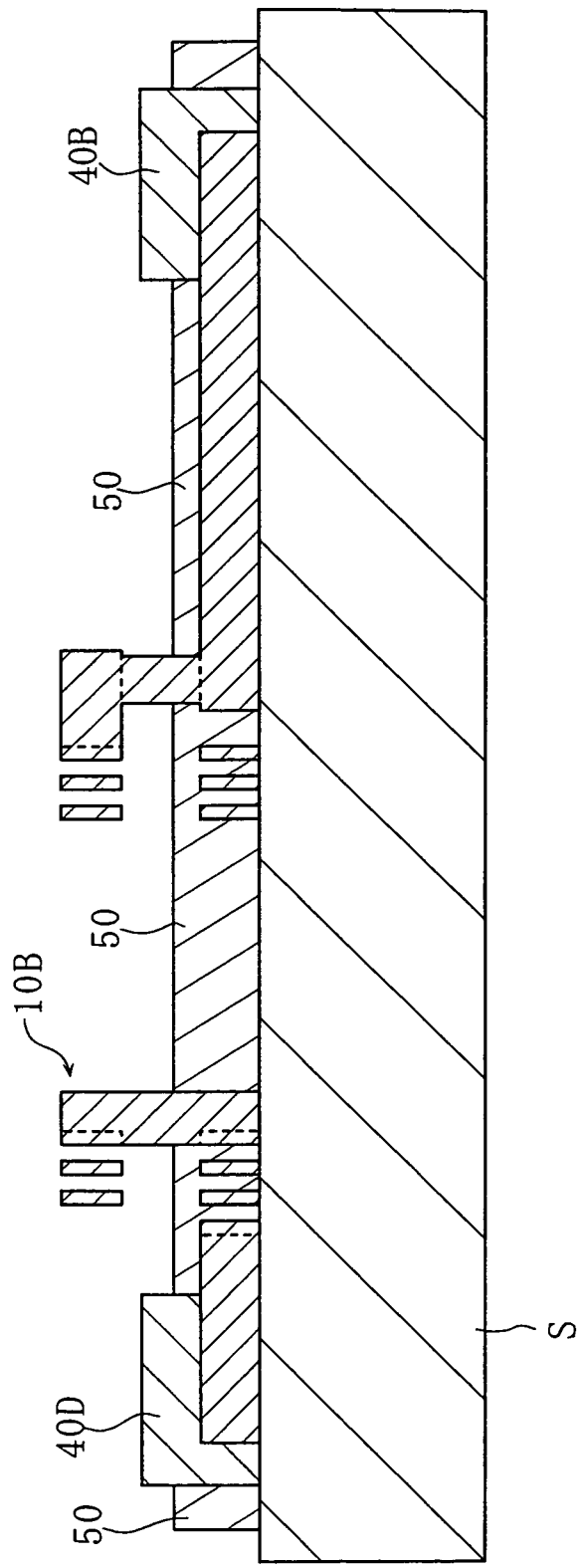
FIG. 19 is another sectional view of the second variation of the integrated electronic device in FIG. 2. The sectional view is comparable to FIG. 4 of the integrated electronic device shown in FIG. 2.
Figure 22:
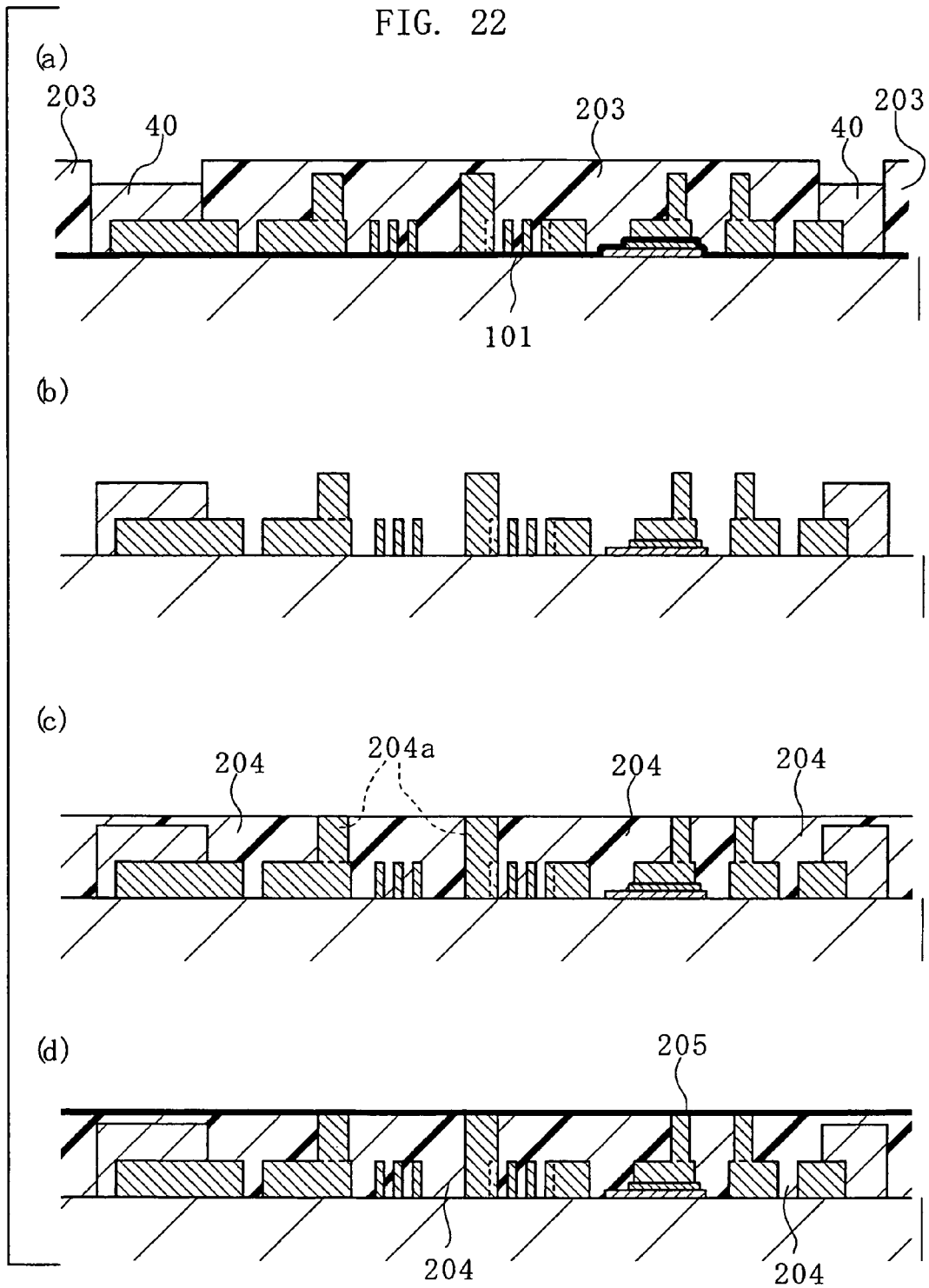
FIG. 22 shows steps following the steps in FIG. 21.
Figure 23:
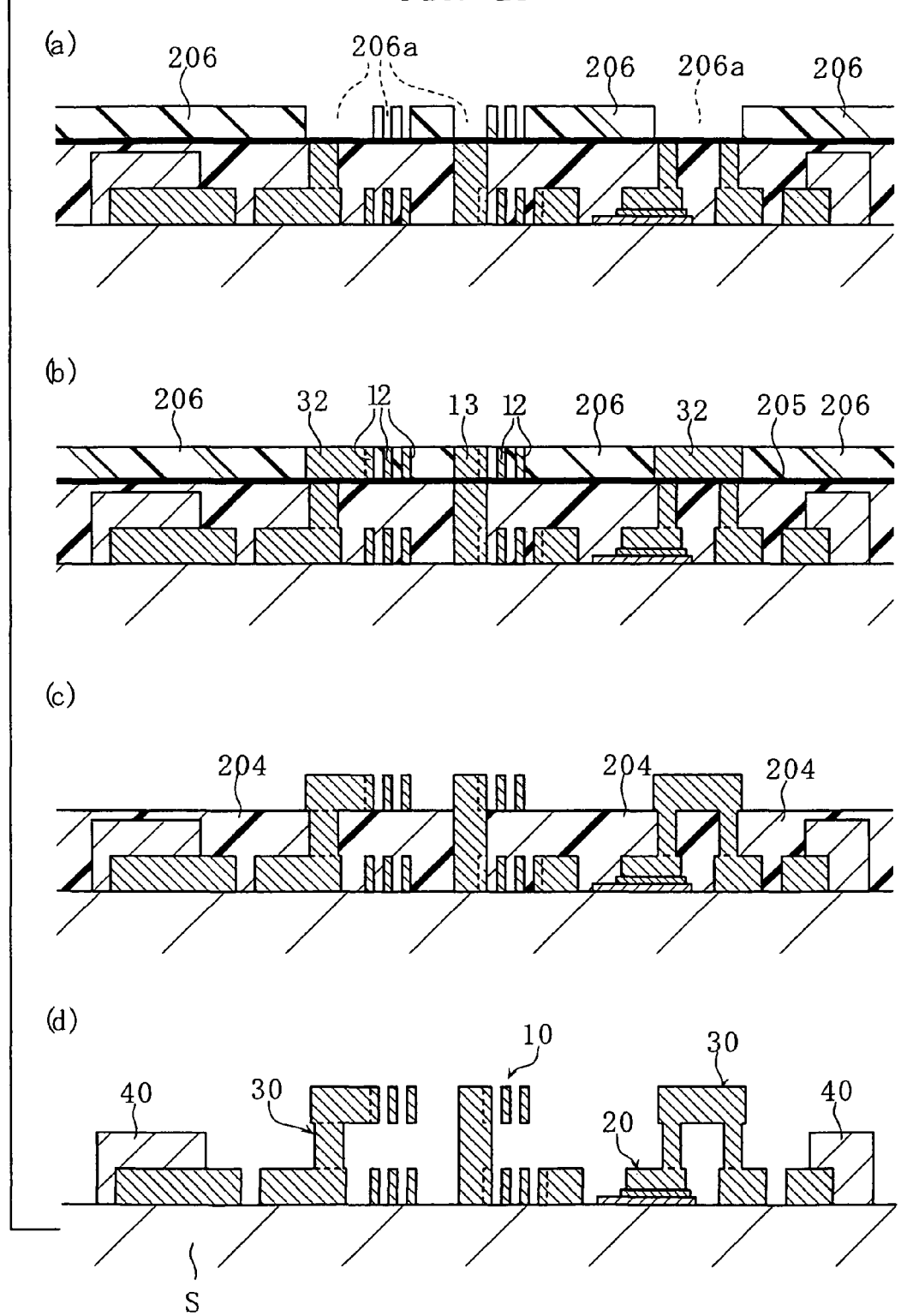
FIG. 23 shows steps following the steps in FIG. 22.
Figure 24:
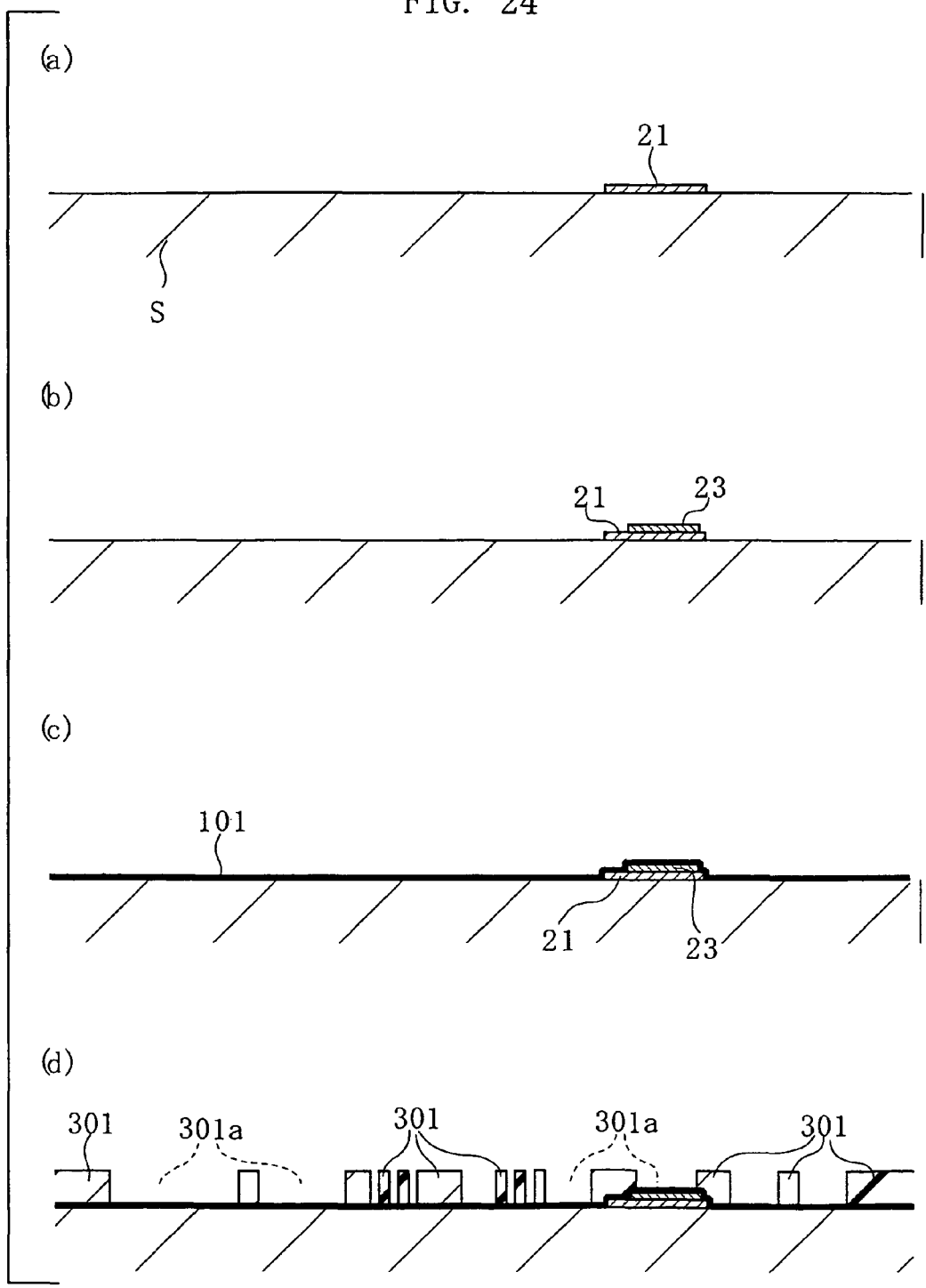
FIG. 24 shows a few steps of another method of making the first variation.
Figure 27:
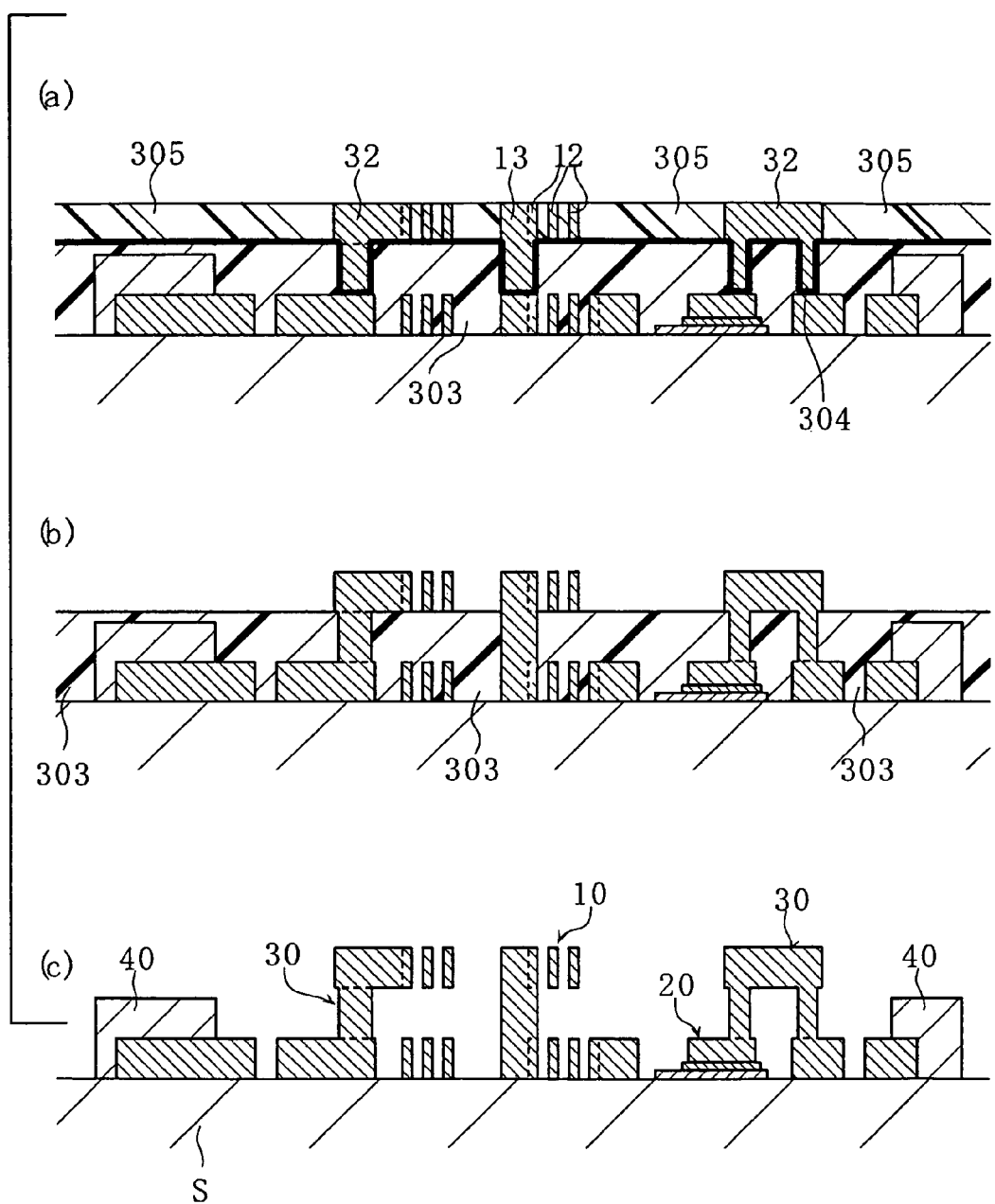
FIG. 27 shows steps following the steps in FIG. 26.
Figure 28:
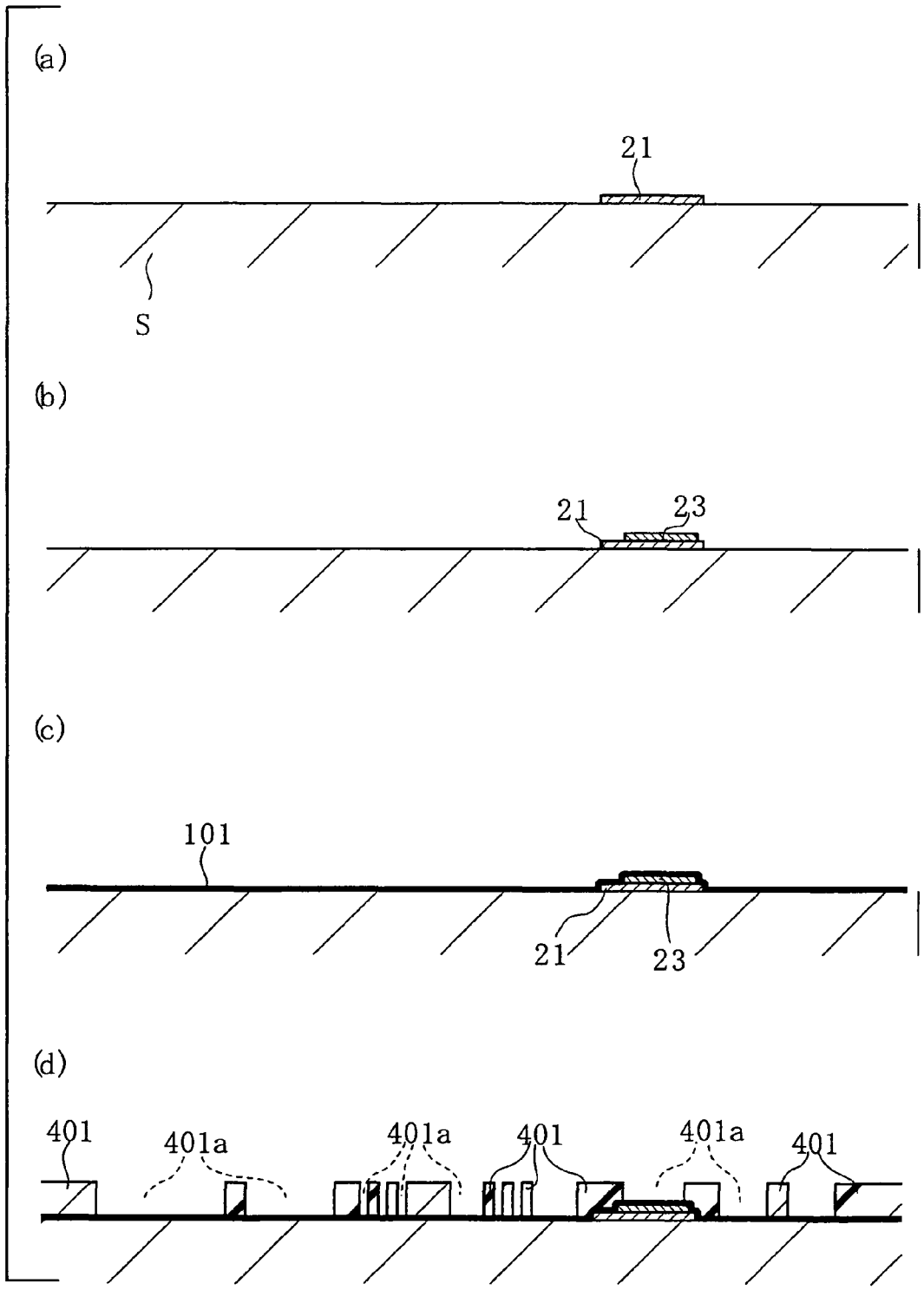
FIG. 28 shows a few steps of a method of making the second variation.
Figure 29:
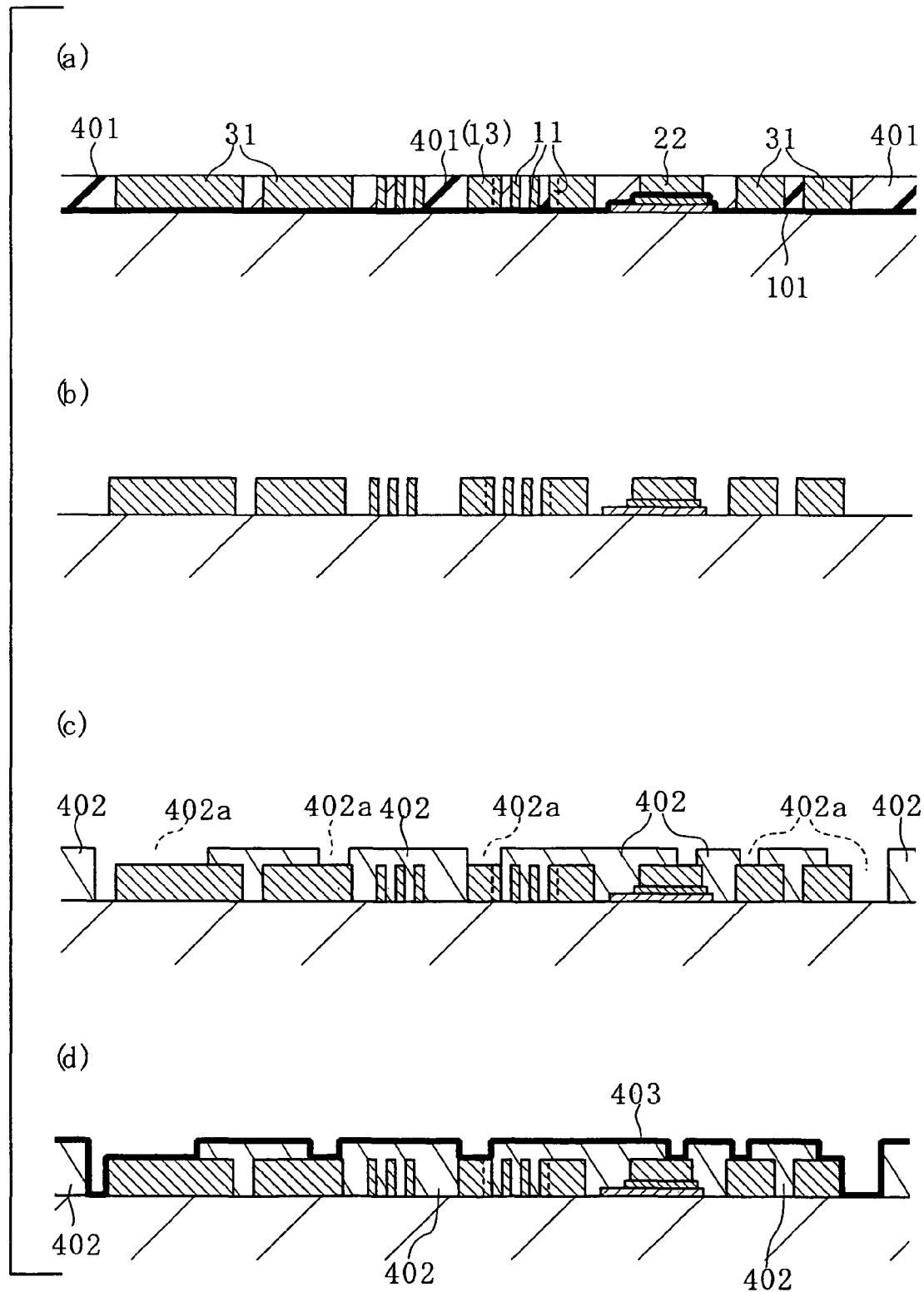
FIG. 29 shows steps following the steps in FIG. 28.
Figure 31:
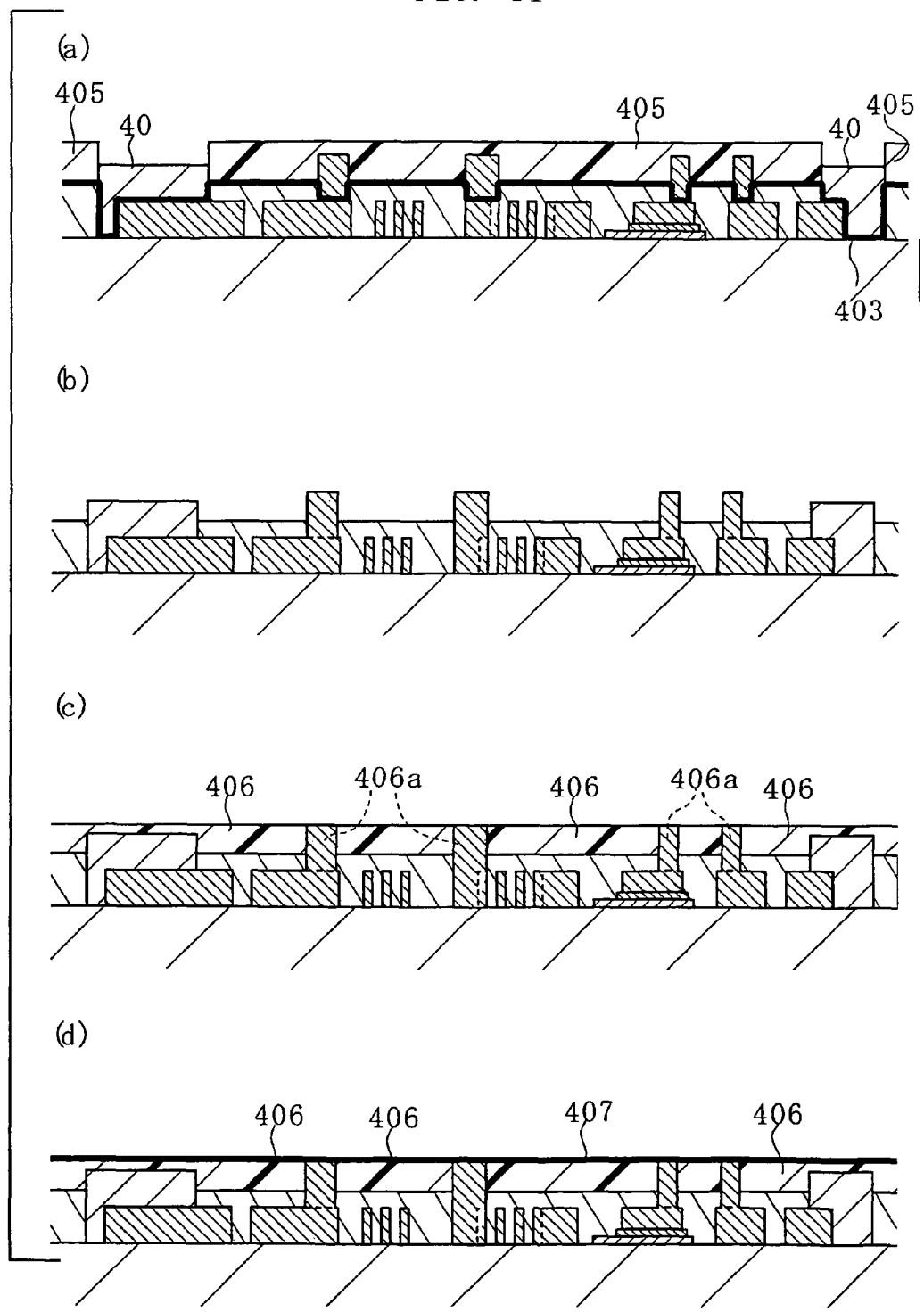
FIG. 31 shows steps following the steps in FIG. 30.
Figure 32:
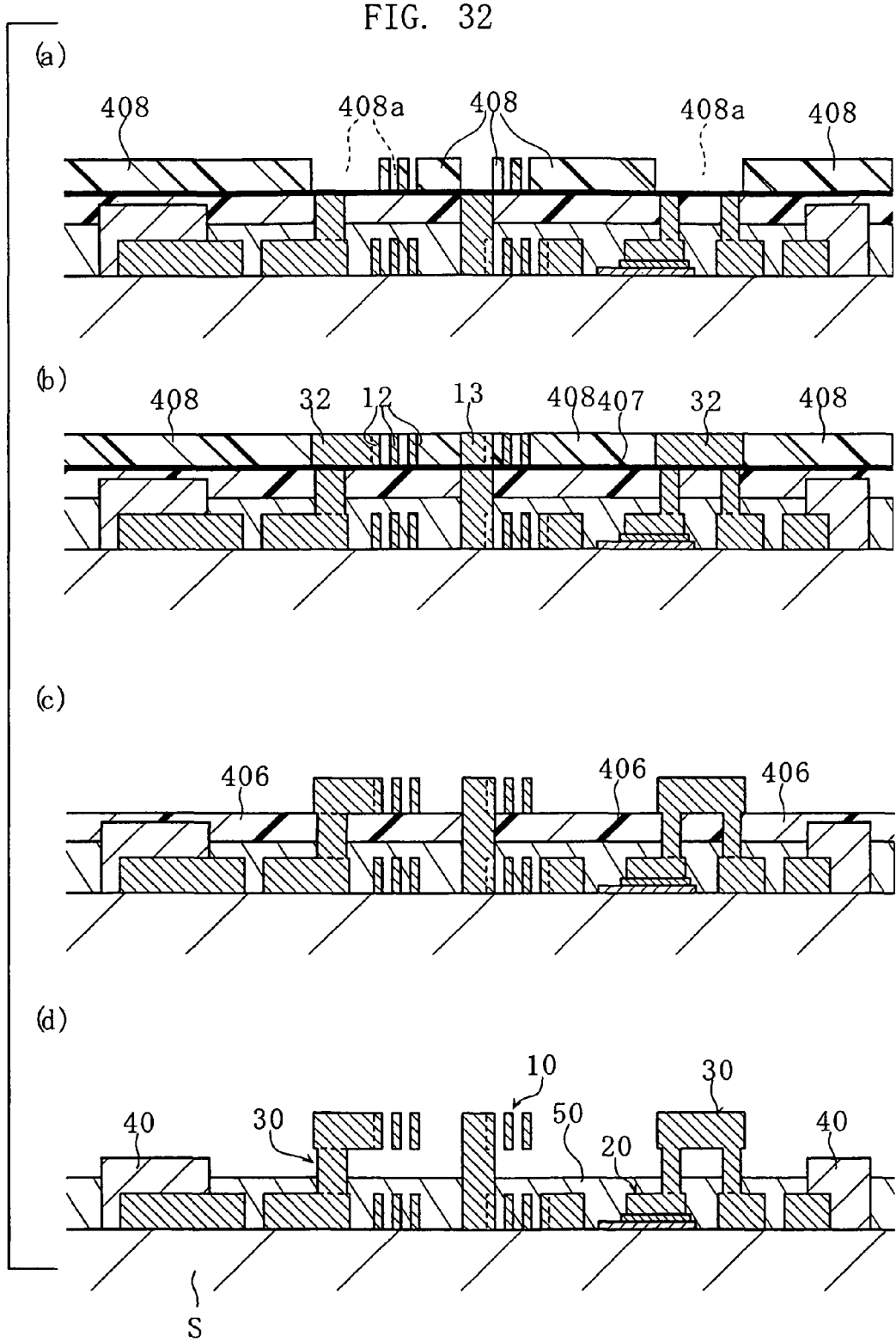
FIG. 32 shows steps following the steps in FIG. 31.

Further, an integrated electronic device X may be as shown in FIG. 18 and FIG. 19: Specifically, the multi-stage coil inductors 10A, 10B may be in contact with the substrate S and then be sealed partially by a sealant 50 (Second Variation). The sealant 50 is provided by a resin material such as BCB, PBO and polyimide. After formation of a conductor portion in a higher tier (such as the spiral coil 12 and the second wiring portion 32), it is sometimes difficult to coat a conductor portion in a lower tier (such as the spiral coil 11 and the first wiring portion 11) with the above-mentioned corrosion resistant film. According to the present variation, conductor portions in a lower tier is covered by the sealant 50 and rendered corrosion resistant, so there is no need for coating the conductor portion in a lower tier with the corrosion resistant film after formation of the conductor portion in a higher tier.

FIG. 20 through FIG. 23 show a first method of making the first variation described earlier. This is a method for manufacturing the first variation by using bulk micromachining technology. Throughout FIG. 20 to FIG. 23, views of a section will be given to illustrate a process of forming components which are shown in FIG. 23(d), i.e. a multi-stage coil inductor 10, a capacitor 20, two pads 40, and a three-dimensional wiring 30 as well as how they are connected. The section includes a plurality of regions included in a single block of a material substrate from which a single integrated electronic device is formed. The series of sectional views are illustrative sequential depictions. The multi-stage coil inductor 10 represents the multi-stage coil inductors 10A, 10B, and the pad 40 represents the pads 40A through 40D.

In the present method, first, as shown in FIG. 20(a), a first electrode 21 of the capacitor 20 is formed on a substrate S. Next, as shown in FIG. 20(b), a dielectric layer 23 of the capacitor 20 is formed on the first electrode 21. Next, as shown in FIG. 20(c), a seed layer 101 for electroplating is formed on the substrate S, covering the first electrode 21 and the dielectric layer 23. These processes are the same as the processes already described above with reference to FIGS. 10(a) through (c).

Next, as shown in FIG. 20(d), a resist pattern 201 for formation of a first-tier thick conductor is formed. In the present method, the first-tier thick conductor provides the spiral coil 11 and part of the connecting member 13 of the multi-stage coil inductor 10, the second electrode 22 of the capacitor 20, and the first wiring portion 31 of the three-dimensional wiring 30. The resist pattern 201 has openings 201a corresponding to the pattern of the spiral coil 11, the part of connecting member 13, the second electrode 22, and the first wiring portion 31.

Next, as shown in FIG. 20(e), the first-tier thick conductor (the spiral coil 11, the part of connecting member 13, the second electrode 22, and the first wiring portion 31) is formed by electroplating method. During the electroplating process, electricity is applied to the seed layer 101.

Next, as shown in FIG. 21(a), a resist pattern 202 is formed on the resist pattern 201, for forming a second-tier thick conductor. In the present method, the second-tier thick conductor provides part of the connecting member 13 of the multi-stage coil inductor 10, and the third wiring portion 33 of the three-dimensional wiring 30. The resist pattern 202 has openings 202a corresponding to the pattern of the part of connecting member 13 and of the third wiring portion 33.

Next, as shown in FIG. 21(b), the second-tier thick conductor (the part of connecting member 13 and the third wiring portion 33) is formed by electroplating method, in the openings 202a of the resist pattern 202. During the electroplating process, electricity is applied to the seed layer 101. Thereafter, as shown in FIG. 21(c), the resist patterns 201 and 202 are removed.

Next, as shown in FIG. 21(d), a resist pattern 203 is formed for forming the pads. The resist pattern 203 has openings 203a each corresponding to the pattern of one pad 40.

Next, as shown in FIG. 22(a), the pads 40 are formed by electroplating method, in the openings 203a of the resist pattern 203. During the electroplating process, electricity is applied to the seed layer 101. Each of the pads 40 is preferably provided by a piece of Ni having its upper surface coated with a film of Au. Thereafter, as shown in FIG. 22(b), the resist pattern 203 is removed, and after the removal, exposed portions of the seed layer 101 are removed (Note that non-exposed portions of the seed layer 101 are not illustrated in FIG. 22(b) or the figures thereafter).

Next, as shown in FIG. 22(c), a resist pattern 204 is formed. The resist pattern 204 serves as a sacrifice layer for forming a third-tier thick conductor on the second-tier thick conductor, and has openings 204a corresponding to the pattern of the second-tier thick conductor. In the present method, the third-tier thick conductor provides the spiral coil 12 and part of the connecting member 13 of the multi-stage coil inductor 10, as well as the second wiring portion 32 of the three-dimensional wiring 30. The resist pattern 204 is formed so that part of the second-tier thick conductor is exposed in the openings 204a.

Next, as shown in FIG. 22(d), a seed layer 205 (indicated by a thick solid line) is formed to cover the surface of the resist pattern 204 and surfaces of the second-tier thick conductor exposed in the openings 204a.

Next, as shown in FIG. 23(a), a resist pattern 206 is formed for forming the third-tier thick conductor. The resist pattern 206 has openings 206a corresponding to the spiral coil 12 and part of the connecting member 13 of the multi-stage coil inductor 10 as well as the second wiring portion 32 of the three-dimensional wiring 30.

Next, as shown in FIG. 23(b), the third-tier thick conductor (the spiral coil 12, the part of connecting member 13, and the second wiring portion 32) is formed by electroplating method, in the openings 206a of the resist pattern 206. During the electroplating process, electricity is applied to the seed layer 205.

Next, as shown in FIG. 23(c), the resist patterns 206 is removed, and after the removal, exposed portions of the seed layer 205 are removed (Note that non-exposed portions of the seed layer 205 are not illustrated in FIG. 23(c) or the figures thereafter).

Next, as shown in FIG. 23(d), the resist pattern 204 is removed. After the removal of the resist pattern 204, preferably, exposed portions of the multi-stage coil inductor 10 and/or those of the three-dimensional wiring 30 are coated with a film selected from corrosion resistant films and magnetic films, or the coating is made with a multi-layered film which includes the selected film. By the steps to described thus far as the above, it is possible to form a multi-stage coil inductor 10, a capacitor 20, a three-dimensional wiring 30 and pads 40 on a substrate S, and thereby to manufacture the first variation described earlier.

FIG. 24 through FIG. 27 show a second method of making the first variation described above. This is a method for manufacturing the first variation by using bulk micromachining technology. Throughout FIG. 24 to FIG. 27, views of a section will be given to illustrate a process of forming components which are shown in FIG. 27(c), i.e. a multi-stage coil inductor 10, a capacitor 20, two pads 40, and a three-dimensional wiring 30 as well as how they are connected. The section includes a plurality of regions included in a single block of a material substrate from which a single integrated electronic device is formed. The series of sectional views are illustrative sequential depictions. The multi-stage coil inductor 10 represents the multi-stage coil inductors 10A, 10B, and the pad 40 represents the pads 40A through 40D.

In the present method, first, as shown in FIG. 24(a), a first electrode 21 of the capacitor 20 is formed on a substrate S. Next, as shown in FIG. 24(b), a dielectric layer 23 of the capacitor 20 is formed on the first electrode 21. Next, as shown in FIG. 24(c), a seed layer 101 for electroplating is formed on the substrate S, covering the first electrode 21 and the dielectric layer 23. These processes are the same as the processes already described above with reference to FIGS. 10(a) through (c).

Next, as shown in FIG. 24(d), a resist pattern 301 for formation of a first-tier thick conductor is formed. In the present method, the first-tier thick conductor provides the spiral coil 11 and part of the connecting member 13 of the multi-stage coil inductor 10, the second electrode 22 of the capacitor 20, and the first wiring portion 31 of the three-dimensional wiring 30. The resist pattern 301 has openings 301a corresponding to the pattern of the spiral coil 11, part of the connecting member 13, the second electrode 22 and the first wiring portion 31.

Next, as shown in FIG. 25(a), the first-tier thick conductor (the spiral coil 11, the part of connecting member 13, the second electrode 22, and the first wiring portion 31) is formed by electroplating method in the openings 301a of the resist pattern 301. During the electroplating process, electricity is applied to the seed layer 102. Thereafter, as shown in FIG. 25(b), the resist pattern 301 is removed with e.g. remover solvent.

Next, as shown in FIG. 25(c), a resist pattern 302 is formed for forming the pads. The resist pattern 302 has openings 302a each corresponding to the pattern of one pad 40.

Next, as shown in FIG. 25(d), the pads 40 are formed by electroplating method, in the openings 302a of the resist pattern 302. During the electroplating process, electricity is applied to the seed layer 101. Each of the pads 40 is preferably provided by a piece of Ni having its upper surface coated with a film of Au. Thereafter, as shown in FIG. 26(a), the resist patterns 302 is removed, and after the removal, exposed portions of the seed layer 101 are removed (Note that non-exposed portions of the seed layer 101 are not illustrated in FIG. 26(a) or the figures thereafter).

Next, as shown in FIG. 26(b), a resist pattern 303 is formed for formation of a second-tier thick conductor. In the present method, the second-tier thick conductor provides part of the connecting member 13 of the multi-stage coil inductor 10, and the third wiring portion 33 of the three-dimensional wiring 30. The resist pattern 303 has openings 303a corresponding to the part of connecting member 13 and the third wiring portion 33, and is formed so that part of the first-tier thick conductor is exposed in the openings 303a. The resist pattern 303 serves as a sacrifice layer for forming a third-tier thick conductor on the second-tier thick conductor. In the present method, the third-tier thick conductor provides the spiral coil 12 and part of the connecting member 13 of the multi-stage coil inductor 10, as well as the second wiring portion 32 of the three-dimensional wiring 30.

Next, as shown in FIG. 26(c), a seed layer 304 (indicated by a thick solid line) is formed to cover the surface of the resist pattern 303 and surfaces of the first-tier thick conductor exposed in the openings 303a.

Next, as shown in FIG. 26(d), a resist pattern 305 is formed for forming the third-tier thick conductor. The resist pattern 305 has openings 305a corresponding to the spiral coil 12 and the part of connecting member 13 of the multi-stage coil inductor 10 as well as the second wiring portion 32 of the three-dimensional wiring 30.

Next, as shown in FIG. 27(a), the second-tier thick conductor (the part of connecting member 13, and the third wiring portion 33) is formed in the openings 303a of the resist pattern 303 while the third-tier thick conductor (the spiral coil 12, the part of connecting member 13, and the second wiring portion 32) is formed in the openings 305a of the resist pattern 305 by electroplating method. During the electroplating process, electricity is applied to the seed layer 304.

Next, as shown in FIG. 27(b), the resist patterns 305 is removed, and after the removal, exposed portions of the seed layer 304 are removed (Note that non-exposed portions of the seed layer 304 are not illustrated in FIG. 27(b) or the figures thereafter).

Next, as shown in FIG. 27(c), the resist pattern 303 is removed. After the removal of the resist pattern 303, preferably, exposed portions of the multi-stage coil inductor 10 and/or those of the three-dimensional wiring 30 are coated with a film selected from corrosion resistant films and magnetic films, or the coating is made with a multi-layered film which includes the selected film. By the steps described thus far as the above, it is possible to form a multi-stage coil inductor 10, a capacitor 20, a three-dimensional wiring 30, and pads 40 on a substrate S, and thereby to manufacture the first variation described earlier.

FIG. 28 through FIG. 32 show a method of making the second variation described earlier. This is a method for manufacturing the second variation by using bulk micromachining technology. Throughout FIG. 28 to FIG. 32, views of a section will be given to illustrate a process of forming components which are shown in FIG. 32(d), i.e. a multi-stage coil inductor 10, a capacitor 20, two pads 40, and a three-dimensional wiring 30 as well as how they are connected. The section includes a plurality of regions included in a single block of a material substrate from which a single integrated electronic device is formed. The series of sectional views are illustrative sequential depictions. The multi-stage coil inductor 10 represents the multi-stage coil inductors 10A, 10B, and the pad 40 to represents the pads 40A through 40D.

In the present method, first, as shown in FIG. 28(a), a first electrode 21 of the capacitor 20 is formed on a substrate S. Next, as shown in FIG. 28(b), a dielectric layer 23 of the capacitor 20 is formed on the first electrode 21. Next, as shown in FIG. 28(c), a seed layer 101 for electroplating is formed on the substrate S, covering the first electrode 21 and the dielectric layer 23. These processes are the same as the processes already described above with reference to FIGS. 10(a) through (c).

Next, as shown in FIG. 28(d), a resist pattern 401 for formation of a first-tier thick conductor is formed. In the present method, the first-tier thick conductor provides the spiral coil 11 and part of the connecting member 13 of the multi-stage coil inductor 10, the second electrode 22 of the capacitor 20, and the first wiring portion 31 of the three-dimensional wiring 30. The resist pattern 401 has openings 401a corresponding to the pattern of the spiral coil 11, the part of connecting member 13, the second electrode 22 and the first wiring portion 31.

Next, as shown in FIG. 29(a), the first-tier thick conductor (the spiral coil 11, the part of connecting member 13, the second electrode 22 and the first wiring portion 31) is formed by electroplating method. During the electroplating process, electricity is applied to the seed layer 101. Thereafter, as shown in FIG. 29(b), the resist pattern 401 is removed, and then, exposed portions of the seed layer 101 are removed (Note that non-exposed portions of the seed layer 101 are not illustrated in FIG. 29(b) or the figures thereafter).

Next, a dielectric film 402 is formed as shown in FIG. 29(c). The dielectric film 402 has a predetermined opening 402a. The dielectric film 402 can be formed by first making a film of a predetermined dielectric material by spin-coating method or spraying method, and then patterning the film.

Next, as shown in FIG. 29(d), a seed layer 403 (indicated by a thick solid line) is formed to cover the surface of the dielectric film 402 and surfaces of the first-tier thick conductor exposed in the openings 402a.

Next, as shown in FIG. 30(a), a resist pattern 404 is formed for forming a second-tier thick conductor. In the present method, the second-tier thick conductor provides part of the connecting member 13 of the multi-stage coil inductor 10, and the third wiring portion 33 of the three-dimensional wiring 30. The resist pattern 404 has openings 404a corresponding to the pattern of the part of connecting member 13 and the third wiring portion 33 of the three-dimensional wiring 30.

Next, as shown in FIG. 30(b), the second-tier thick conductor (the part of connecting member 13, and the third wiring portion 33) is formed by electroplating method, in the openings 404a of the resist pattern 404. During the electroplating process, electricity is applied to the seed layer 403. Thereafter, as shown in FIG. 30(c), the resist pattern 404 is removed.

Next, as shown in FIG. 30(d), a resist pattern 405 is formed for forming the pads. The resist pattern 405 has openings 405a each corresponding to the pattern of one pad 40.

Next, as shown in FIG. 31(a), the pads 40 are formed by electroplating method, in the openings 405a of the resist pattern 405. During the electroplating process, electricity is applied to the seed layer 403. Each of the pads 40 is preferably provided by a piece of Ni having its upper surface coated with a film of Au. Thereafter, as shown in FIG. 31(b), the resist pattern 405 is removed, and after the removal, exposed portions of the seed layer 403 are removed (Note that non-exposed portions of the seed layer 403 are not illustrated in FIG. 31(b) or the figures thereafter).

Next, as shown in FIG. 31(c), a resist pattern 406 is formed. The resist pattern 406 serves as a sacrifice layer for forming a third-tier thick conductor on the second-tier thick conductor, and has openings 406a corresponding to the pattern of the second-tier thick conductor. In the present method, the third-tier thick conductor provides the spiral coil 12 and part of the connecting member 13 of the multi-stage coil inductor 10, as well as the second wiring portion 32 of the three-dimensional wiring 30. The resist pattern 406 is formed so that part of the second-tier thick conductor is exposed in the openings 406a.

Next, as shown in FIG. 31(d), a seed layer 407 (indicated by a thick solid line) is formed to cover the surface of the resist pattern 406 and surfaces of the second-tier thick conductor exposed in the openings 406a.

Next, as shown in FIG. 32(a), a resist pattern 408 is formed for forming the third-tier thick conductor. The resist pattern 408 has openings 408a corresponding to the spiral coil 12 and part of the connecting member 13 of the multi-stage coil inductor 10 as well as the second wiring portion 32 of the three-dimensional wiring 30.

Next, as shown in FIG. 32(b), the third-tier thick conductor (the spiral coil 12, the part of connecting member 13, and the second wiring portion 32) is formed by electroplating method, in the openings 408a of the resist pattern 408. During the electroplating process, electricity is applied to the seed layer 407.

Next, as shown in FIG. 32(c), the resist patterns 408 is removed, and after the removal, exposed portions of the seed layer 407 are removed (Note that non-exposed portions of the seed layer 407 are not illustrated in FIG. 32(c) or the figures thereafter).

Next, as shown in FIG. 32(d), the resist pattern 406 is removed. After the removal of the resist pattern 406, preferably, exposed portions of the multi-stage coil inductor 10 and/or those of the three-dimensional wiring 30 are coated with a film selected from corrosion resistant films and magnetic films, or with a multi-layered film including the selected film. By following the steps described thus far as the above, it is possible to form a multi-stage coil inductor 10, a capacitor 20, a three-dimensional wiring 30, and pads 40 on a substrate S, and thereby to manufacture the second variation described earlier.

Figure 33:
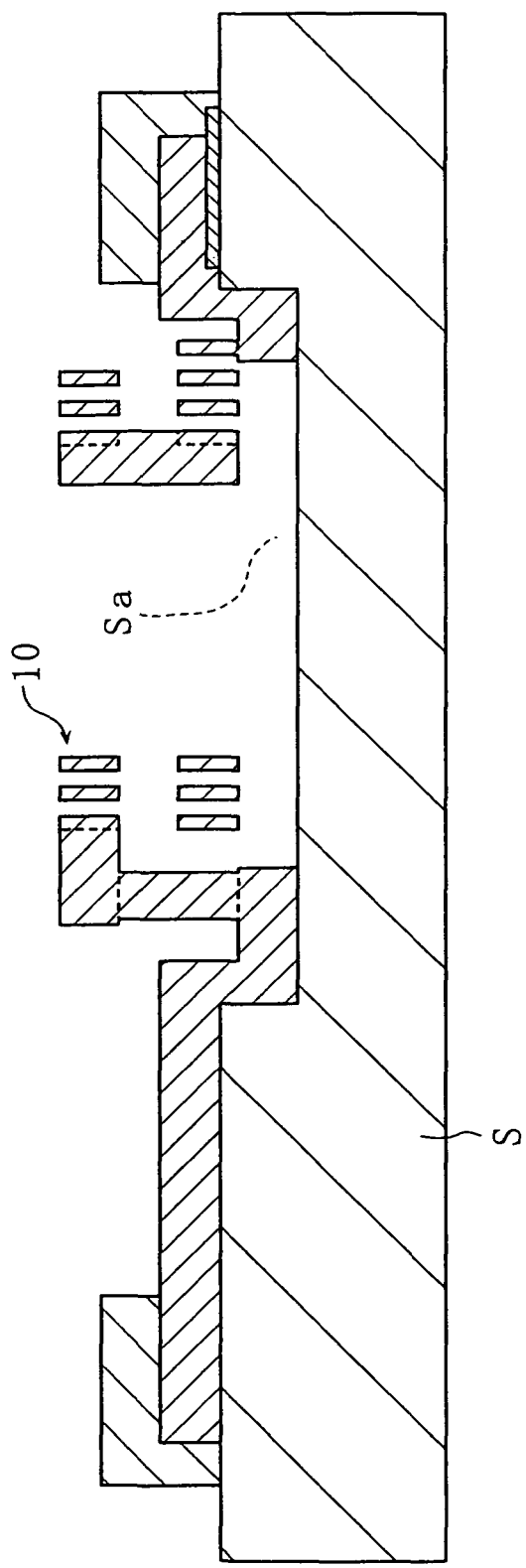
FIG. 33 is a sectional view of a third variation of the integrated electronic device in FIG. 2. The sectional view is comparable to FIG. 3 of the integrated electronic device shown in FIG. 2.

In the integrated electronic device X, the substrate S may be provided with a recess Sa as shown in FIG. 33, and the multi-stage coil inductor 10 may be formed in the recess (Third Variation). Such an arrangement is suitable for reducing the size of the integrated electronic device X.

The integrated electronic device according to the present invention may include predetermined resisters and/or filters instead of or in addition to the multi-stage coil inductor 10 and/or the capacitor 20. Examples of the filter include LCR filters, SAW filters, FBAR filters and mechanical oscillation filters. Examples of the mechanical oscillation filter include micromechanical disc resonators, micromechanical ring resonators and micromechanical beam resonators.

Figure 34:
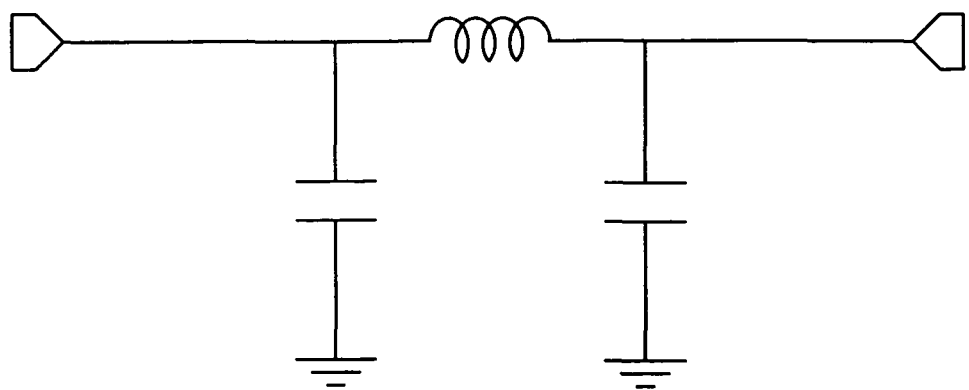
FIG. 34 shows another circuit for the integrated electronic device according to the present invention.
Figure 35:
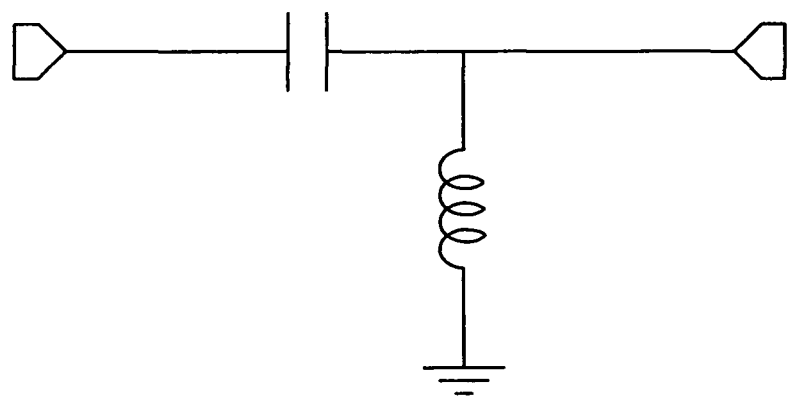
FIG. 35 shows still another circuit for the integrated electronic device according to the present invention.

In the integrated electronic device according to the present invention, the numbers of the multi-stage coil inductor 10, capacitor 20 and pads 40, as well as layout thereof on the substrate S, and the form of the three-dimensional wiring 30 may be appropriately modified whereby the circuit construction in FIG. 6 can be changed into those as in FIG. 34 and in FIG. 35. Further, in the integrated electronic device according to the present invention, more complex circuits can be built by appropriately combining the circuits shown in FIG. 6, FIG. 34 and FIG. 35.

In the integrated electronic device according to the present invention, the multi-stage coil inductors 10 may be replaced by other types of multi-stage coil inductors provided by e.g. solenoid coils or toroidal coils. Further, the integrated electronic device according to the present invention may include a resin sealant which covers the entire structure on the substrate. In this case, the resin sealant may enter the space between mutually adjacent coil wires of the multi-stage coil inductors. A resin sealant is suitable for achieving a high level of reliability in the integrated electronic device.

The invention claimed is:

1. A method of making an integrated electronic device, the method comprising the steps of:
    forming a lower conductive portion by electroplating;
    forming a first resist pattern having an opening for formation of an upper conductive portion on the lower conductive portion, the opening allowing part of the lower conductive portion to expose;
    forming a seed layer over a surface of the first resist pattern and a surface of the lower conductive portion exposed in the opening;
    forming a second resist pattern on the first resist pattern, the second resist pattern being formed with an opening;
    forming the upper conductor portion by electroplating in the opening of the second resist pattern;
    removing the second resist pattern;
    removing the seed layer; and
    removing the first resist pattern.

2. The method according to claim 1, wherein the opening of the second pattern is formed above a region in which the lower conductive portion is exposed from the opening of the first resist pattern and a part of the first resist pattern.

3. The method according to claim 1, wherein:

the lower conductive portion includes a first coil;

the upper conductive portion includes a second coil; and removing the first resist pattern includes spacing the first coil and the second coil apart from each other by a gap in a direction in which the first coil and the second coil are staked.

4. The method according to claim 3, wherein:

the lower conductive portion includes the first coil, at least a part of an external connection and a part of three-dimensional wiring; and the upper conductive portion includes the second coil and an other part of the three-dimensional wiring.

\* \* \* \* \*